(12) United States Patent
Udrea et al.

(10) Patent No.: US 7,235,439 B2
(45) Date of Patent: Jun. 26, 2007

(54) METHOD OF FORMING A MOS-CONTROLLABLE POWER SEMICONDUCTOR DEVICE FOR USE IN AN INTEGRATED CIRCUIT

(75) Inventors: Florin Udrea, Cambridge (GB); Gehan A J Amaratunga, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 0 days.

(21) Appl. No.: 11/174,606

(22) Filed: Jul. 6, 2005

(65) Prior Publication Data

US 2005/0242369 A1    Nov. 3, 2005

Related U.S. Application Data

(63) Continuation of application No. 10/694,736, filed on Oct. 29, 2003, now Pat. No. 6,927,102, which is a continuation of application No. 09/957,547, filed on Sep. 21, 2001, now Pat. No. 6,703,684.

(60) Provisional application No. 60/234,219, filed on Sep. 21, 2000.

(51) Int. Cl.
*H01L 21/8238* (2006.01)

(52) U.S. Cl. .................. 438/212; 438/138; 438/140; 438/268

(58) Field of Classification Search ........ 438/137–138, 438/140, 133, 156, 173, 212, 268, 284, 286
See application file for complete search history.

(56) References Cited

U.S. PATENT DOCUMENTS

| | | | |
|---|---|---|---|
| 3,689,992 A | 9/1972 | Schutze et al. | |
| 5,241,210 A | 8/1993 | Nakagawa et al. | |
| 5,274,265 A | 12/1993 | Tsuruta | |
| 5,313,092 A | 5/1994 | Tsuruta et al. | |
| 5,354,695 A | 10/1994 | Leedy | |
| 5,373,183 A | 12/1994 | Beasom | |
| 5,378,920 A | 1/1995 | Nakagawa et al. | |
| 5,420,458 A | 5/1995 | Shimoji | |
| 5,430,316 A | 7/1995 | Contiero et al. | |
| 5,434,444 A | 7/1995 | Nakagawa et al. | |
| 5,463,243 A | 10/1995 | Sakurai et al. | |
| 5,468,982 A | 11/1995 | Hshieh et al. | |
| 5,631,491 A | 5/1997 | Matsuzaki | |

(Continued)

FOREIGN PATENT DOCUMENTS

EP    08167617    6/1996

(Continued)

*Primary Examiner*—Thanhha S. Pham
(74) *Attorney, Agent, or Firm*—Pillsbury Winthrop Shaw Pittman LLP

(57) ABSTRACT

A power semiconductor device has an active region that includes a drift region. At least a portion of the drift region is provided in a membrane which has opposed top and bottom surfaces. In one embodiment, the top surface of the membrane has electrical terminals connected directly or indirectly thereto to allow a voltage to be applied laterally across the drift region. In another embodiment, at least one electrical terminal is connected directly or indirectly to the top surface and at least one electrical terminal is connected directly or indirectly to the bottom surface to allow a voltage to be applied vertically across the drift region. In each of these embodiments, the bottom surface of the membrane does not have a semiconductor substrate positioned adjacent thereto.

7 Claims, 42 Drawing Sheets

U.S. PATENT DOCUMENTS

| | | |
|---|---|---|
| 5,633,209 A | 5/1997 | Leedy |
| 5,654,220 A | 8/1997 | Leedy |
| 5,837,553 A | 11/1998 | Pearce |
| 5,840,593 A | 11/1998 | Leedy |
| 5,895,972 A | 4/1999 | Paniccia |
| 6,008,126 A | 12/1999 | Leedy |
| 6,040,617 A | 3/2000 | Patel |
| 6,069,396 A | 5/2000 | Funaki |
| 6,074,890 A | 6/2000 | Yao et al. |
| 6,104,062 A * | 8/2000 | Zeng .......................... 257/341 |
| 6,111,280 A | 8/2000 | Gardner et al. |
| 6,124,179 A | 9/2000 | Adamic |
| 6,444,487 B1 | 9/2002 | Boggs et al. |
| 2002/0003274 A1 * | 1/2002 | Bryzek et al. .............. 257/414 |
| 2002/0105028 A1 | 8/2002 | Fujihira |

FOREIGN PATENT DOCUMENTS

| | | |
|---|---|---|
| JP | 8-167617 | 6/1996 |
| WO | WO94/22167 | 9/1994 |
| WO | WO98/32009 | 7/1998 |
| WO | WO00/42662 | 7/2000 |

* cited by examiner

METHOD OF FORMING A MOS-CONTROLLABLE POWER SEMICONDUCTOR DEVICE FOR USE IN AN INTEGRATED CIRCUIT

CROSS-REFERENCE TO RELATED APPLICATIONS

This application claims priority to and is a continuation of U.S. application Ser. No. 10/694,736, filed Oct. 29, 2003, now U.S. Pat. No. 6,927,102 which is a continuation of U.S. application Ser. No. 09/957,547, filed Sep. 21, 2001, now U.S. Pat. No. 6,703,684, which claims priority to U.S. Provisional Application No. 60/234,219, filed Sep. 21, 2000.

This application is also related to U.S. patent application Ser. No. 10/694,735, filed Oct. 29, 2003, now U.S. Pat. No. 6,900,518. The contents of all of which are incorporated herein by reference.

The present invention relates to a semiconductor device and to a method of forming a semiconductor device.

The present invention is particularly concerned with high voltage/power semiconductor devices which can be used as discrete devices, in hybrid circuits and in power integrated circuits and is particularly concerned with field-effect transistors, such as power MOSFETs, insulated gate bipolar transistors (IGBTs) and other types of power devices such as diodes, transistors and thyristors.

For devices designed for use in integrated circuits, it is preferred that the main terminals (variously called the anode/cathode, drain/source and emitter/collector) and the control terminals (termed the gate or base) are placed at the surface of the device in order to be easily accessible. The main current flow is between the main terminals and is therefore principally lateral. Such devices are therefore typically referred to as lateral devices. Such devices are often integrated with low-voltage devices or circuits built in CMOS-type or other standard planar technologies to form power integrated circuits. Several high voltage/power devices may be integrated in the same chip. Isolation is provided between the high-power and the low-power devices as well as between adjacent power devices. Two principal isolation technologies have emerged, namely junction-isolation (JI) technology and silicon-on-insulator (SOI) technology.

In JI technology, a reverse-biased junction is used to isolate adjacent devices. However, this is in many cases not satisfactory for power integrated circuits since minority carrier conduction through the semiconductor substrate (on which the active part of the device is formed) can take place and interference between adjacent devices is therefore difficult to prevent. In addition, JI bipolar devices (such as the lateral IGBT) also suffer from parasitic mobile carrier plasma stored in the semiconductor substrate in the on-state which has to be removed during turn-off. This decreases dramatically the switching speed of the devices.

In SOI technology, a buried insulating layer is used to isolate vertically the top semiconductor layer from the bottom semiconductor layer and, accordingly, current conduction is principally restricted to the top semiconductor layer and there is practically no current in the bottom semiconductor layer in any mode of operation. Horizontal or lateral isolation in SOI is typically provided via trenches which are filled with oxide or by use of the known LOCOS ("local oxidation of silicon") isolation. SOI technology offers better isolation than JI technology because the buried insulating layer prevents current conduction and plasma formation in the substrate.

High voltage semiconductor devices have incorporated within the body of the device a high voltage junction that is responsible for blocking the voltage. This junction includes a relatively lowly doped semiconductor layer which withstands the largest portion of the voltage across the main terminals when the device is in the off-state and operating in the voltage blocking mode. This layer is commonly referred to as the drift region or layer and is partially or fully depleted of minority carriers during this operating mode. Ideally, the potential is equally distributed along the drift region between the two ends of the drift region. However, as shown by the 1-D Poisson equation, for a given doping of the drift region, the distribution of the electric field has a triangular shape or, when fully depleted, a trapezoidal shape. Since the area underneath the electric field can be approximated as the breakdown voltage when the peak of the electric field reaches the critical electric field in the semiconductor, it is obvious that for a 1-D junction, the lower the doping of the drift layer, the higher the breakdown voltage. However, for majority carrier devices such as MOSFET types, known as LDMOSFETs, the on-state resistance of the drift layer is inversely proportional to the doping of the drift layer. Since a low on-resistance is desired for a high voltage switch, it follows that a low doping concentration affects the on-state performance of the device. In addition for lateral devices, the critical electric field at the surface is smaller than in the bulk, adding further difficulties in designing high voltage lateral devices.

The introduction of the RESURF (Reduced Surface Field Effect) technique for JI devices allows an increase in the breakdown voltage of lateral devices through the use of an additional vertical junction formed between the drift region and the semiconductor substrate. FIG. 1a shows schematically a conventional JI diode using the RESURF effect. This diode is provided as part of a conventional lateral power device such as a lateral transistor, LDMOSFET or LIGBT. FIG. 1a also shows the distribution of the potential lines and the edge of the depletion region during the voltage blocking mode. It can be noted that the drift layer 1 is fully depleted but the semiconductor substrate 2 is not fully depleted. The potential lines bend as they drop in the substrate, from the vertical direction towards the horizontal direction, such that below the high voltage terminal 3, the potential lines are practically parallel to the bottom surface 4 of the substrate 2. This is because the thickness of the semiconductor substrate 2 is relatively large (typically 300 μm) compared to the vertical extension of the depletion region from the top surface 5 into the substrate 2 (typically 60 μm for a 600V device). Hence, the semiconductor substrate 2 is not fully depleted when the breakdown of the device occurs. It is known that a lateral JI diode can achieve breakdown voltages equivalent to those of vertical diodes, in spite of the reduced surface critical electric field. Nevertheless, as shown in FIG. 1a, even an optimised electric field distribution using the RESURF concept is far from being ideal (i.e. rectangular in shape). In addition as already mentioned, the JI devices suffer from high leakage currents and very poor isolation, which makes integration within a power integrated circuit very difficult.

FIG. 1b shows a conventional SOI diode which is typically found as part of a SOI lateral high voltage power device. The structure can be made using the known wafer bonding, Unibond or SIMOX SOI technologies. Other technologies such as Silicon-on-Diamond (SOD) are also known. FIG. 1b also shows the equi-potential line distribution during the voltage blocking mode. It can be seen that the potential lines crowd towards the edges of the drift layer 1, resulting in a poor RESURF effect. Increasing the thickness of the buried oxide 6 helps to redistribute the potential lines more evenly at the top surface 5. However, in general, the breakdown voltage is still below that of a JI device or JI diode as shown in FIG. 1a. Again, the potential lines in the drift layer 1 and the buried silicon oxide insulating layer 6 below the high voltage terminal are practically aligned to the horizontal surface. This is due to the fact that the semiconductor substrate 2 is not entirely depleted. The result is that all the potential lines have to crowd into the drift layer 1 and insulating layer 6 in the case of SOI and moreover have to align parallel to the insulating layer 6/semiconductor substrate 2 interface. This creates an uneven distribution of the potential lines at the top surface 5 which results in high electric field peaks and therefore lower breakdown voltages. In addition, for SOI devices, the conservation of the perpendicular component of the electric flux density D=∈E at the top of the semiconductor layer 1/buried oxide 6 interface limits the maximum voltage that the buried oxide 6 can sustain before the critical electric field in the semiconductor layer 1 at the interface is reached. This vertical breakdown yields a very strong limitation on the maximum voltage rating achievable for a given buried oxide thickness.

Thus, in summary, in both JI and SOI devices, the potential lines have to bend from a vertical orientation to a horizontal or lateral orientation and the potential distribution in the drift layer is far from ideal.

Moreover, when a power integrated circuit made in thin SOI technology comprises at least a half-bridge configuration, which involves two power devices operating in different modes, the device operating in the high side mode may suffer from pinch-off of the drift region during the on-state. This is due to the high electric field in the drift region caused by the high negative potential created in the semiconductor substrate with respect to the potential of one of the main terminals of the high-side device.

It is therefore apparent that the semiconductor substrate in the SOI technology is not passive in all operation modes and its presence results in a poor distribution of the potential lines during the voltage blocking mode, which may cause premature breakdown commonly at the surface of the semiconductor or at the buried oxide/top semiconductor interface due to vertical breakdown. The JI approach suffers from very poor isolation within the power integrated circuit and the breakdown voltage, although generally higher than in the SOI devices, is still lower than would be preferred.

For discrete devices or hybrid circuits used in high voltage or power electronics, it is preferred that the main terminals have a vertical orientation and are placed at opposite sides of the wafer (e.g. with the low voltage terminal at the top and the high voltage terminal at the bottom). These devices are referred to as vertical high voltage/power devices. Compared to lateral devices, the current flow between the main terminals is principally vertical and this results in a larger current capability and a higher breakdown voltage. Such devices are however difficult to use in integrated circuits. Example of known high voltage/power devices are DMOS & Trench MOSFETs, DMOS & Trench IGBTs and Cool MOS.

For an optimised trade-off between on-state/switching/breakdown performance, the vertical devices require a narrow drift region that is preferably fully depleted at full voltage blocking. Such a layer may have a thickness from 6 µm to 180 µm for devices rated from 50 V to 1.2 kV. Commonly the drift layer lies on a highly doped semiconductor substrate. The semiconductor substrate however introduces a series of negative effects on the general performance of the device. First, it introduces a parasitic resistance, which leads to increased on-state power losses. Secondly, for bipolar devices with anode injection such as IGBTs, since the doping of the substrate is high, to reduce the power losses in the substrate resistance, the injection from the substrate which acts as the anode (emitter) of the device is in most cases too strong, leading to high transient switching losses and slow turn-off due to the a large amount of plasma stored inside the drift region during on-state. Thirdly, the substrate introduces a thermal resistance which prevents effective dissipation of heat to an external sink placed at the bottom of the device. Finally, if vertical devices are to be used in integrated circuits, the presence of the thick semiconductor substrate makes isolation between adjacent devices very difficult.

There have been numerous prior proposals for increasing the breakdown voltage of semiconductor devices, particularly power semiconductor devices. Examples are disclosed in U.S. Pat. No. 5,241,210, U.S. Pat. No. 5,373,183, U.S. Pat. No. 5,378,920, U.S. Pat. No. 5,430,316, U.S. Pat. No. 5,434,444, U.S. Pat. No. 5,463,243, U.S. Pat. No. 5,468,982, U.S. Pat. No. 5,631,491, U.S. Pat. No. 6,040,617, and U.S. Pat. No. 6,069,396. However, none of these prior art proposals has tackled the problem of increasing the breakdown voltage by a detailed consideration of the electric potential lines in the drift region.

In WO-A-98/32009, there is disclosed a gas-sensing semiconductor device. A gas-sensitive layer is formed over a MOSFET heater which is used to heat the gas-sensitive layer. The substrate on which the device is formed is back-etched to form a thin membrane in the sensing area. It should be noted that the MOSFET heater is a low voltage device (and as such does not have a drift region) and, furthermore, the thin membrane is formed below the MOSFET heater solely to facilitate heating of the sensing area to very high temperatures and not to affect the field or potential lines in the device.

U.S. Pat. No. 5,895,972 discloses a method and apparatus for cooling a semiconductor device during the testing and debugging phases during development of a device. In place of conventional heat slugs such as copper, a heat slug of material that is transparent to infra red is fixed to the device. A diamond heat slug is disclosed as preferred. It is disclosed that the substrate on which the device is formed can be thinned prior to applying the infra red transparent heat slug to the device. The purpose of this thinning of the substrate is to reduce transmission losses that occur during optical testing and debugging of the device using infra red beams. There is no discussion of the type of semiconductor device to which the heat slug is applied and there is no disclosure that the device is a power device having a drift region. Moreover, as stated, the purpose of the thinning of the substrate and application of the heat slug is solely to facilitate testing of the device using optical testing and debugging. This process is carried out during development of the device. The heat slug is not used during normal operation of the device.

There have been a number of proposals in the prior art for semiconductor devices which make use of a so-called membrane. Examples include U.S. Pat. No. 5,420,458, WO-A-94/22167, U.S. Pat. No. 3,689,992 and U.S. Pat. No. 6,008,126. In the case of each of these prior art proposals, the semiconductor device is not a power device and thus does not have a drift region. In each case, the membrane arrangement is used to provide for isolation between semiconductor devices in an integrated circuit or between regions within a semiconductor device and/or to remove or lower coupling parasitic capacitances. In each case, since these are low voltage devices, the breakdown voltage is virtually unaffected by the membrane structure.

According to a first aspect of the present invention, there is provided a power semiconductor device having an active region that includes a drift region, at least a portion of the drift region being provided in a membrane having opposed top and bottom surfaces, the top surface of the membrane having electrical terminals connected directly or indirectly thereto to allow a voltage to be applied laterally across the drift region, the bottom surface of the membrane not having a semiconductor substrate positioned adjacent thereto.

According to a second aspect of the present invention, there is provided a power semiconductor device having an active region that includes a drift region provided in a layer, the layer being provided on a semiconductor substrate, at least a portion of the semiconductor substrate below at least a portion of the drift region being removed such that said at least a portion of the drift region is provided in a membrane defined by that portion of the layer below which the semiconductor substrate has been removed, the top surface of the membrane having electrical terminals connected directly or indirectly thereto to allow a voltage to be applied laterally across the drift region.

According to a third aspect of the present invention, there is provided a power semiconductor device having an active region that includes a drift region, at least a portion of the drift region being provided in a membrane having opposed top and bottom surfaces, at least one electrical terminal connected directly or indirectly to the top surface and at least one electrical terminal connected directly or indirectly to the bottom surface to allow a voltage to be applied vertically across the drift region, the bottom surface of the membrane not having a semiconductor substrate positioned adjacent thereto.

According to a fourth aspect of the present invention, there is provided a power semiconductor device having an active region that includes a drift region provided in a layer, the layer being provided on a semiconductor substrate, at least a portion of the semiconductor substrate below at least a portion of the drift region being removed such that said at least a portion of the drift region is provided in a membrane defined by that portion of the layer below which the semiconductor substrate has been removed, and at least one electrical terminal connected directly or indirectly to the top surface and at least one electrical terminal connected directly or indirectly to the bottom surface to allow a voltage to be applied vertically across the drift region.

The said at least a portion of the drift region is fully or substantially fully depleted of mobile charge carriers when a voltage is applied across terminals of the device. In the first and second aspects of the present invention, the potential lines in said at least a portion of the drift region are substantially perpendicular to the top and bottom surfaces of the membrane and substantially uniformly spread laterally across said at least a portion of the drift region. This in turn leads to a higher breakdown voltage which may approach the ideal or theoretical limit. In the third and fourth aspects, the potential lines in said at least a portion of the drift region are substantially parallel to the top and bottom surfaces of the membrane and substantially uniformly spaced vertically across said at least a portion of the drift region.

Thus, in the preferred embodiments, the absence of the semiconductor substrate under at least a portion of the depletion region in lateral devices leads to enhanced breakdown ability due to a more favourable electric field and potential distribution within the drift region of the power device. For vertical devices, the absence of the semiconductor substrate allows the formation of a thin drift region and removes parasitic effects such as the parasitic series electrical resistance and substrate thermal resistance.

Power devices typically operate with a voltage in the range 30V to 1.2 kV and a current in the range 100 mA to 50 A. Their application may range from domestic appliances, electric cars, motor control, and power supplies to RF and microwave circuits and telecommunication systems.

It will be appreciated that the terms "top" and "bottom", "above" and "below", and "lateral" and "vertical", are all used in this specification by convention and that no particular physical orientation of the device as a whole is implied.

The so-called membrane power device of the present invention may be of many different types, including for example a diode, a transistor, a thyristor, a MOS controllable device such as a MOSFET, an insulated gate bipolar transistor (IGBT), a double gate device, etc.

In the preferred embodiments discussed further below, there is provided a high voltage, power device with high breakdown voltage capacity coupled with excellent isolation and reduced self-heating.

The arrangement may be such that only part of the drift region is provided in the membrane.

In the first and second aspects, where only a part of the drift region is provided in the membrane, preferably the high voltage terminal end of the drift region is contained within the membrane; the remainder of the drift region, including the low voltage terminal end, may remain outside the membrane.

In the third and fourth aspects, the device edge termination may be provided outside the membrane while the active region which includes part of the drift region is provided within the membrane.

In any aspect, the whole of the drift region may be provided in the membrane.

At least one isolation layer may surround the drift region. The at least one isolation layer may be provided in said membrane or in a separate membrane to extend from the top surface of the membrane to the bottom surface of the membrane.

At least one isolation layer may surround the drift region and be provided outside the membrane.

The or at least one isolation layer may be provided by electrically insulating material. The or at least one isolation layer may be provided by a highly doped semiconductor layer which in use is biased to provide a junction that is reverse-biased or biased below the forward-bias level.

There may be provided at least one additional power device having a drift region at least a portion of which is provided on said membrane or on a separate membrane. The separate membrane is preferably formed over the same original substrate and preferably in the same fabrication step with the or each other membrane provided in the device.

There may be provided at least one low voltage device. Said at least one low voltage device may be provided in said membrane. Alternatively, said at least one low voltage device may be provided outside said membrane. In that case, said at least one low voltage device may be provided in a further membrane, said further membrane being preferably formed over the same original substrate and preferably within the same fabrication step with the other membranes provided in the device. In either case, this arrangement provides a power integrated circuit. The low voltage device or devices may be for example a bipolar or CMOS circuit. Such low voltage power devices may form driving, protection or processing circuits. In the preferred embodiments discussed below, the membrane power devices are well isolated both vertically and laterally from such low voltage devices. The vertical isolation is achieved by virtue of the absence of the parasitic substrate beneath the active region of the power device. Lateral isolation can be achieved as briefly described above by one or more isolation layers provided preferably in a membrane from the top to the bottom surface of the membrane or outside the membrane.

There may be at least one isolation layer providing electrical isolation between adjacent devices. The said isolation layer may be placed on a further membrane, said further membrane preferably being formed over the same original substrate and preferably within the same fabrication step with the or each other membrane provided in the device.

In the first and second aspect of the present invention, the device may comprise an electrically insulating and thermally conductive layer adjacent to the bottom surface of the membrane. The electrically insulating and thermally conductive layer is used to help remove a large part of the heat that might otherwise be trapped within the membrane when the power device is operating. The layer may be of any suitable material such as for example polycrystalline diamond, amorphous diamond, boron nitride, aluminium oxide, etc. The material is preferably formed by blanket deposition as a layer by sputtering or chemical vapor deposition or any other suitable technique. The layer may entirely fill the space under the membrane or may be provided as a thin layer under the membrane and which follows the side walls and the bottom surface of any remaining substrate. The layer is preferably in thermal contact with a heat sink.

In the third and fourth aspects, the bottom terminal may be electrically and thermally conductive. The bottom terminal may be made of a metal or a combination of metals such as aluminium, copper etc. The bottom terminal may fill the space under the membrane. In a preferred embodiment, the bottom terminal is provided as a thin layer under the membrane that follows down side walls of any remaining substrate and under the main bottom surface of the device. This layer is preferably in thermal contact with an external heat sink. Alternatively, more than one bottom terminal, in the form of thin layers isolated from one another, can be placed at the bottom of one or separate membranes.

The membrane may comprise a semiconductor layer provided on an electrically insulating layer. The electrically insulating layer may be an oxide layer as formed in for example known SOI technology. Where substrate is etched away to form the membrane, such an oxide layer conveniently acts as an etch stop, which assists in the formation of the membrane. In the third and fourth aspects, this layer is removed to provide access for the terminal layer to be provided at the bottom.

In the first and second aspects, the device may comprise a mechanically strong and electrically insulating layer provided under the membrane. The mechanically strong and electrically insulating layer provides structural support to the membrane and also acts to minimise the risk of membrane rupture.

In any aspect, the drift region may have a non-uniform doping profile. This helps to ensure that the potential lines in the drift region are substantially uniformly spread across the drift region. This is turn leads to a higher breakdown voltage which may approach the ideal or theoretical limit. The doping concentration of the drift region at a high voltage terminal side of the device is preferably relatively high and the doping concentration of the drift region at a low voltage terminal side of the device is preferably relatively low. The doping concentration of the drift region may vary linearly from one side of the drift region to the other. This serves to improve further the breakdown capability of the device.

In the first and second aspects, the drift region may comprise at least two semiconductor layers of alternating conductivity type arranged one above the other and in contact with each other. In use, these two or more semiconductor layers of alternating conductivity type provide a semiconductor junction in a vertical direction such that the drift region can be fully depleted of mobile charge carriers when a voltage is applied across terminals of the device. This again helps to ensure that the potential lines in said at least a portion of the drift region are substantially perpendicular to the top and bottom surfaces of the membrane and substantially uniformly spread laterally across said at least a portion of the drift region. This is turn leads to a higher breakdown voltage which may approach the ideal or theoretical limit.

In any aspect, the drift region may comprise a plurality of laterally adjacent semiconductor regions of alternating conductivity type. These laterally adjacent semiconductor regions of alternating conductivity type form plural transverse junctions in the "z" direction of the device, which again helps to ensure that the potential lines in said at least a portion of the drift region are substantially uniformly spread across said at least a portion of the drift region. This is turn leads to a higher breakdown voltage which may approach the ideal or theoretical limit.

In any aspect, the drift region may comprise a plurality of laterally adjacent semiconductor cells of alternating conductivity type arrayed around the plane of the device. The cells may be arranged in a regular or an irregular pattern. Either arrangement again helps to ensure that the potential lines in said at least a portion of the drift region are substantially uniformly spread across said at least a portion of the drift region. This in turn leads to a higher breakdown voltage which may approach the ideal or theoretical limit.

The device may comprise a termination region adjacent to and in contact with the drift region, said termination region being provided to reduce the effect of premature breakdown at the edge of the drift region. At least a portion of the said termination region may be placed inside the membrane. At least a portion of the said termination region may be placed outside the membrane and above any semiconductor substrate. The drift region may be more highly doped than at least a portion of the termination region. The drift region may be more highly doped than the semiconductor substrate.

According to a fifth aspect of the present invention, there is provided a method of forming a power semiconductor device having an active region that includes a drift region, the method comprising the steps of: forming, in a layer provided on a semiconductor substrate, a power semiconductor device having an active region that includes a drift region; and, removing at least a portion of the semiconductor substrate below at least a portion of the drift region such that said at least a portion of the drift region is provided in a membrane defined by that portion of the layer below which the semiconductor substrate has been removed.

It is preferred that the substrate be removed as the last or one of the last steps in the device fabrication process. In that way, the substrate provides support for the device for as long as possible during the fabrication process.

Said at least a portion of the semiconductor substrate may be removed by wet etching.

Said at least a portion of the semiconductor substrate may be removed by dry etching.

Said at least a portion of the semiconductor substrate may be removed using a buried insulating layer as an etch stop. The burial layer may be part of a Silicon-on-Insulator (SOI) structure.

At least one semiconductor layer may be introduced by implantation, diffusion or deposition from the back-side of the device following the formation of the membrane.

A bottom terminal layer may be applied to the bottom of the membrane, said bottom terminal layer being in contact with at least one semiconductor layer within the membrane.

The method may comprise applying an electrically insulating and thermally conductive layer adjacent the bottom surface of the membrane. The electrically insulating and thermally conductive layer may be applied by a (preferably blanket) deposition process.

Alternatively the method may comprise applying an electrically and thermally conductive layer which acts as an electrode (terminal) adjacent the bottom surface of the membrane. The layer may be applied by a blanket deposition.

In formation of the devices and in the methods described above, one or more of bipolar, CMOS, Bi-CMOS, DMOS, SOI, trench technology or known integrated circuit fabrication steps may be employed.

In the devices and methods described above, the drift region may comprise at least one of silicon, silicon carbide, diamond, gallium nitride and gallium arsenide.

Where provided, at least one of the insulating layers may comprise one of silicon dioxide, nitride, diamond, aluminium oxide, aluminium nitride and boron nitride.

Embodiments of the present invention will now be described by way of example with reference to the accompanying drawings, in which.

Figure 2A:
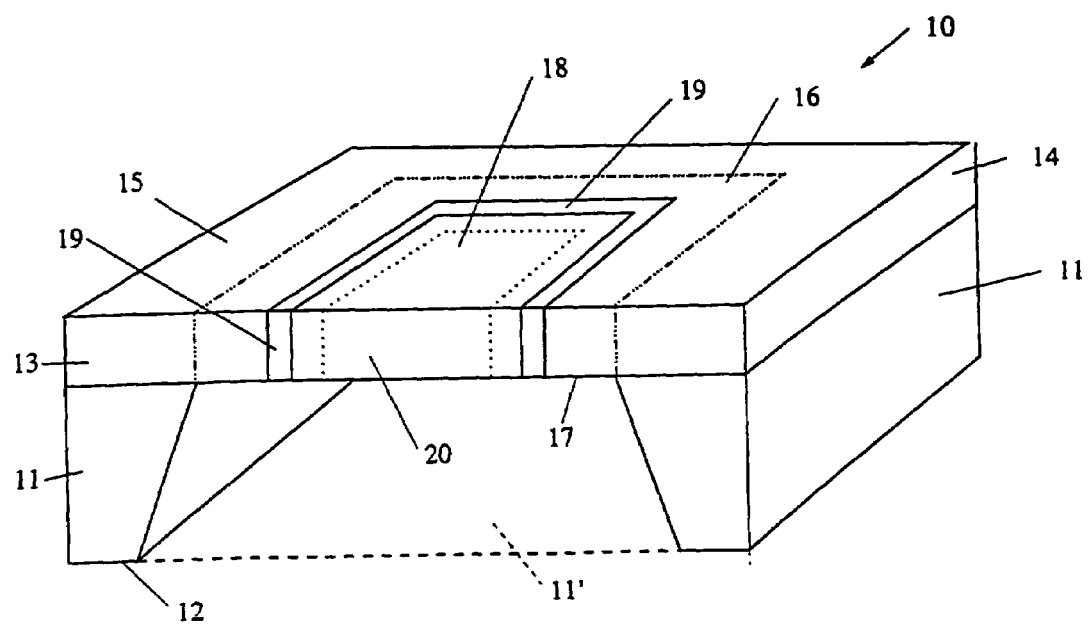
FIG. 2a is a schematic perspective view of a first example of a device according to the present invention.
Figure 2B:
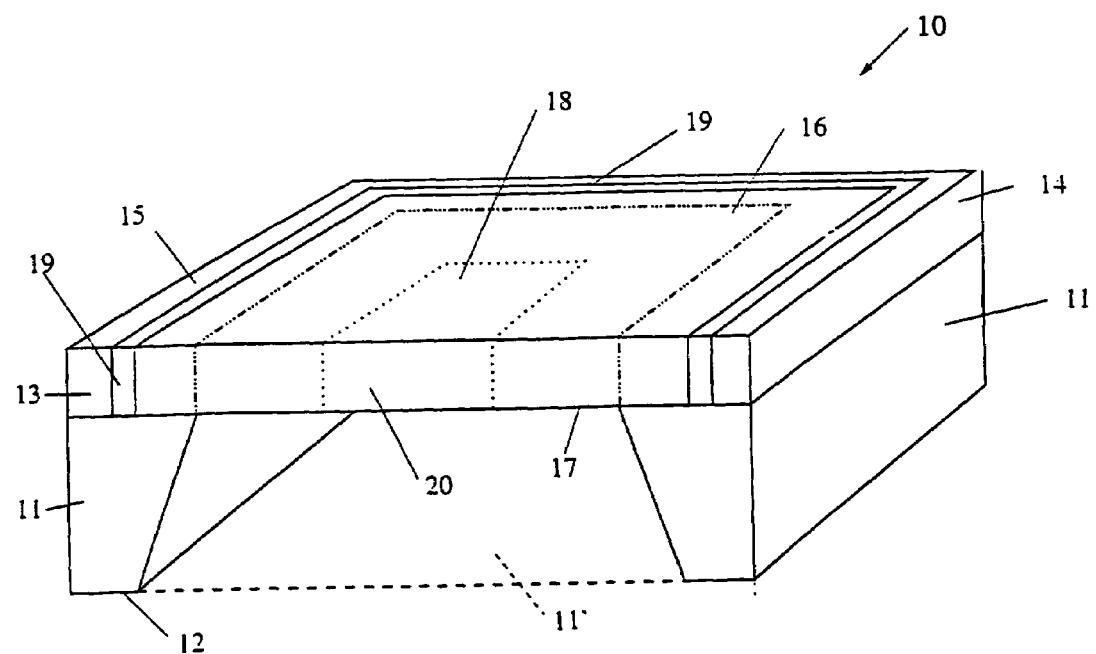
FIG. 2b is a schematic perspective view of a second example of a device according to the present invention.

Referring now to FIGS. 2a and 2b, first and second examples of a membrane power semiconductor device 10 according to the present invention each have a semiconductor substrate 11 having a bottom surface 12 that forms the main bottom surface of the device 10. A first thin layer 13, which in these examples comprises a semiconductor layer 14, is formed on the substrate 11 and has a top surface 15 that forms the main top surface 5 of the device 10. The original full extent of the substrate 11 is indicated in FIGS. 2a and 2b by dashed lines. During manufacture, a portion 11' of the substrate 11 below the thin layer 13 is entirely removed up to the thin layer 13 in order to leave a region of the thin layer 13 below which there is no substrate 11, this region being referred to herein as a membrane 16 (shown within the dot and dashed lines). The remaining portions of the substrate 11 form support legs. The membrane 16 has a bottom surface 17. The active structure 18 of the power device 10 (indicated by dotted lines) is in these examples located entirely within the membrane 16. In the example of FIG. 2a, the active structure 18 is electrically isolated from other devices or circuits by an isolation layer 19 formed within the membrane 16 between the top surface 15 and the membrane bottom surface 17 such that the isolation layer 19 surrounds the active structure 18 of the power device 10. In the example of FIG. 2b, the isolation layer 19 is provided outside the membrane 16 within the thin layer 13 such that it surrounds the active structure 18 of the power device 10. In the examples of both FIGS. 2a and 2b, the power device 10 contains a drift layer 20 that is placed in the semiconductor layer 14 inside the first thin layer 13 and entirely within the membrane 16. The drift layer 20 supports high voltages applied across the main terminals (not shown) of the power device 10 whilst the power device 10 is off and blocks the voltage across the main terminals. During such operating mode, the drift layer 20 becomes partially or ideally completely depleted of mobile carriers. According to an embodiment of this invention, if the main terminals are placed on the top surface 15 of the device and within the membrane 16, the equi-potential lines in a cross-section of the device along the drift layer 20 are practically perpendicular to both the main top surface 15 and the membrane bottom surface 17. According to another embodiment of this invention, if a first main terminal is placed on the surface 15 and within the membrane 16 and a second main terminal is placed adjacent to the bottom membrane and within the membrane 16, the potential lines are practically parallel to both the top and bottom surfaces 15,17.

It is preferred that the substrate portion 11' be removed as the last or one of the last fabrication steps, and particularly after formation of all or substantially all of the structures in and above the thin layer 13 has been completed, so that the entire substrate 11 can support the whole of the thin layer 13 during these fabrication steps.

Figure 1A:
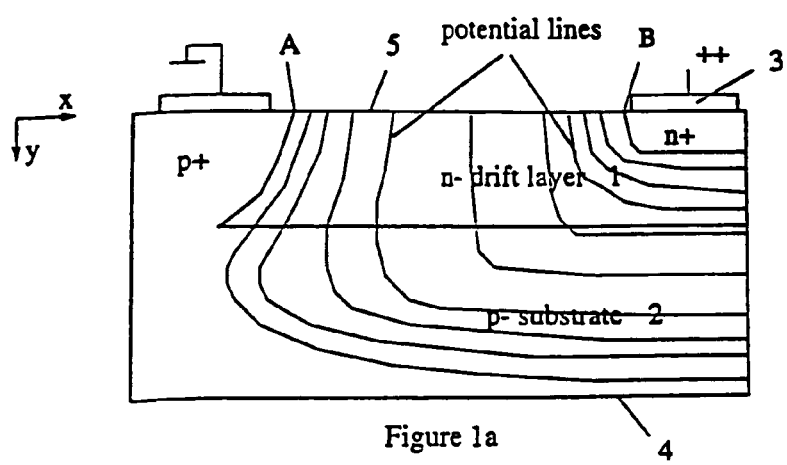
FIG. 1a is a schematic cross-sectional view of a prior art JI power diode.
Figure 1A:
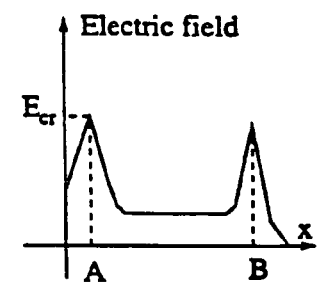
Figure 1B:
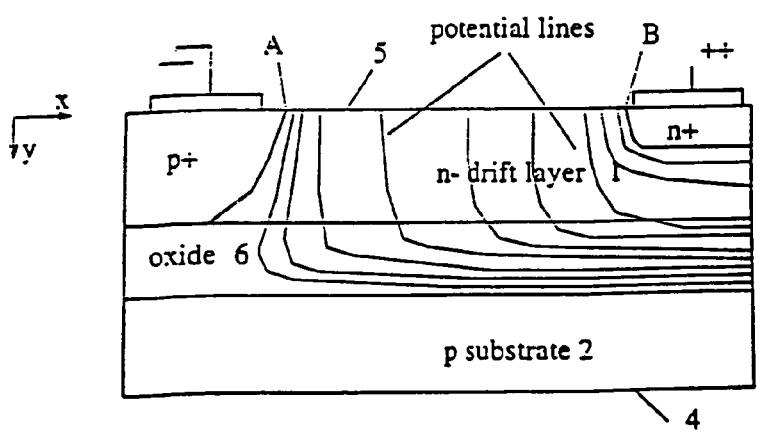
FIG. 1b is a schematic cross-sectional view of a prior art SOI power diode.
Figure 1B:
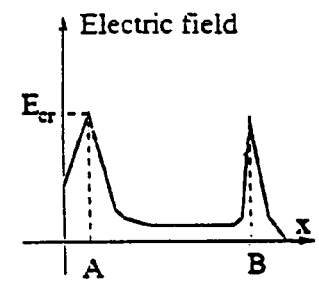
Figure 3A:
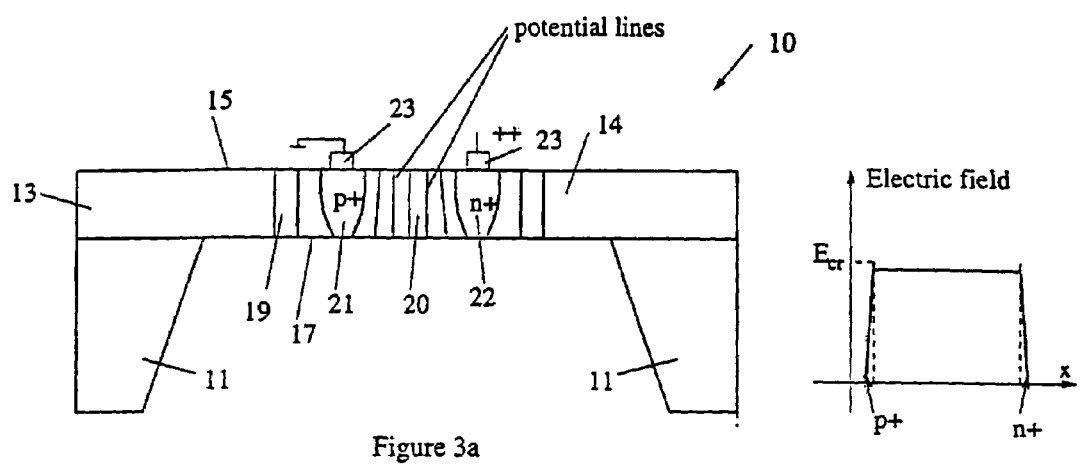
FIG. 3 is a schematic cross-sectional view of another example of a device according to the present invention in which the potential lines are illustrated; and, FIGS. 4 to 43 are schematic cross-sectional or perspective views of further examples of devices according to the present invention.
Figure 3B:
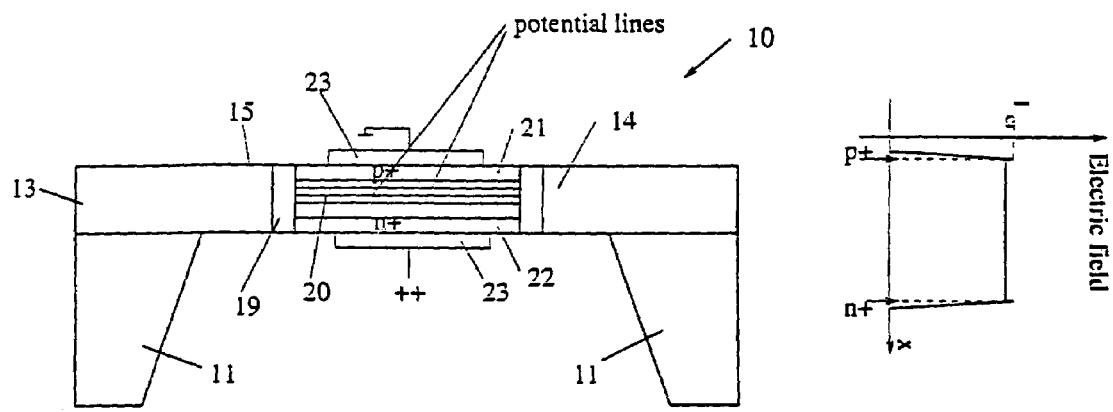

It is worth pointing out here the differences in the two-dimensional potential distribution of prior art high voltage devices, such as conventional junction-isolation (JI) high voltage devices or Silicon-on-Insulator (SOI), and the membrane power devices according to this invention. As can be seen in FIGS. 1a and 1b, for the conventional devices, the potential lines are virtually perpendicular to the top surface 5, but as they drop into the body of the device, they align to be parallel to the bottom substrate surface 4. Such distribution of the potential lines may lead to premature breakdown. FIGS. 3a and 3b show the two-dimensional distribution of the potential lines in an example of a simple power device structure according to the present invention formed by one single high voltage junction. In the example of FIG. 3a, the main terminals 23 are placed on the top surface 15 and the drift region 20 contains for simplicity only one semiconductor layer which is more lowly doped than the p+ anode region 21 and the n+ cathode region 22. This drift region 20 becomes completely depleted during the voltage blocking mode and before the breakdown occurs. Referring to FIG. 3a in comparison with FIG. 1a and FIG. 1b, it can be seen that the potential lines are perpendicular or near perpendicular to both the top surface 15 and the bottom surface 17 of the membrane 16, and substantially uniformly distributed from the anode region 21 to the cathode region 22 inside the drift region 20 such that the value of the breakdown voltage approaches its ideal limit. In the example of FIG. 3b, the main terminals 23 are on the top surface 15 and bottom surface 17 respectively such that the potential lines are parallel or near parallel to both the top surface 15 and the bottom surface 17, and substantially uniformly distributed from the anode region 21 to the cathode region 22 inside the drift region 20 such that the breakdown voltage is ideal for a given thickness of the drift layer 20.

Figure 4A:
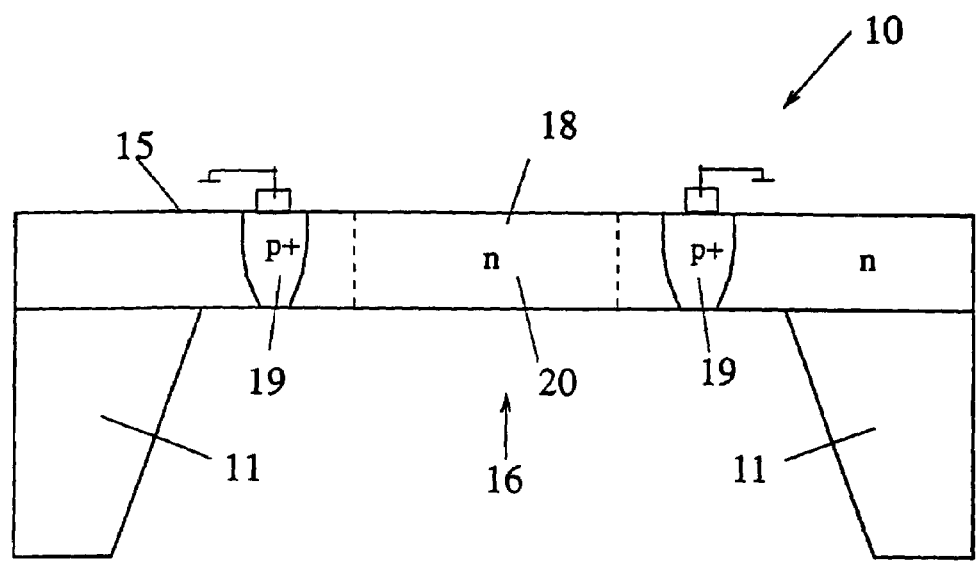
Figure 4B:
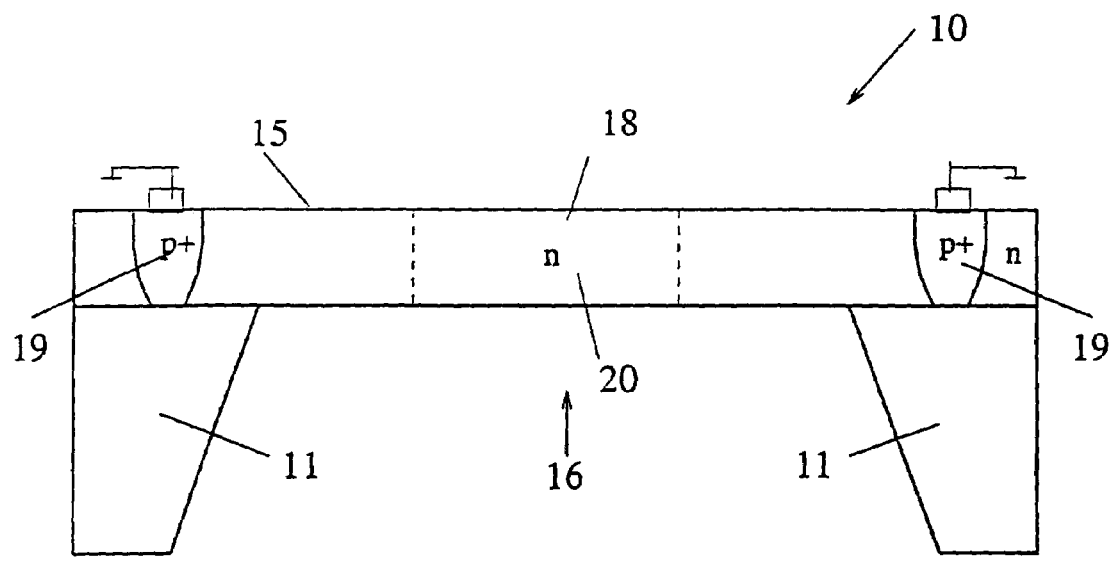

The preferred embodiments of high voltage power devices according to the present invention also differ from the prior art devices in the way the isolation is achieved. The isolation in the preferred membrane power devices is realised vertically in a perfect manner through the absence of substrate below the active structure 18 of the membrane power device 10 and is achieved laterally through the use of an isolation layer 19 which surrounds the active structure 18 of the power device 10.

Where provided, the isolation layer 19 may be in the form of a highly doped semiconductor layer connected to a matched voltage so that all the junctions associated with said isolation layer are reverse biased or zero biased. In this case, the isolation layer acts as an effective conduction barrier. FIGS. 4a and 4b each show an example of a membrane power device 10 having a p+ isolation layer 19 which extends from the top surface 15 to the bottom membrane surface 17 and which surrounds the active structure 18. The p+ isolation layer 19 is connected to ground, which in these examples is assumed to be the lowest potential available in the power integrated circuit. In the example of FIG. 4a, the isolation layer 19 is provided within the membrane 16. In the example of FIG. 4b, the isolation layer 19 is provided outside the membrane 16.

The isolation layer may alternatively be made of an insulating layer such as silicon oxide and may be in the form of a trench or LOCOS layer. As a yet further alternative, the isolation can be made by trenches filled with a sandwich of oxide and polysilicon layers. Other insulation materials can also be used. Another alternative is to use air gaps (so-called "MESA" or "trench" isolation).

Figure 5A:
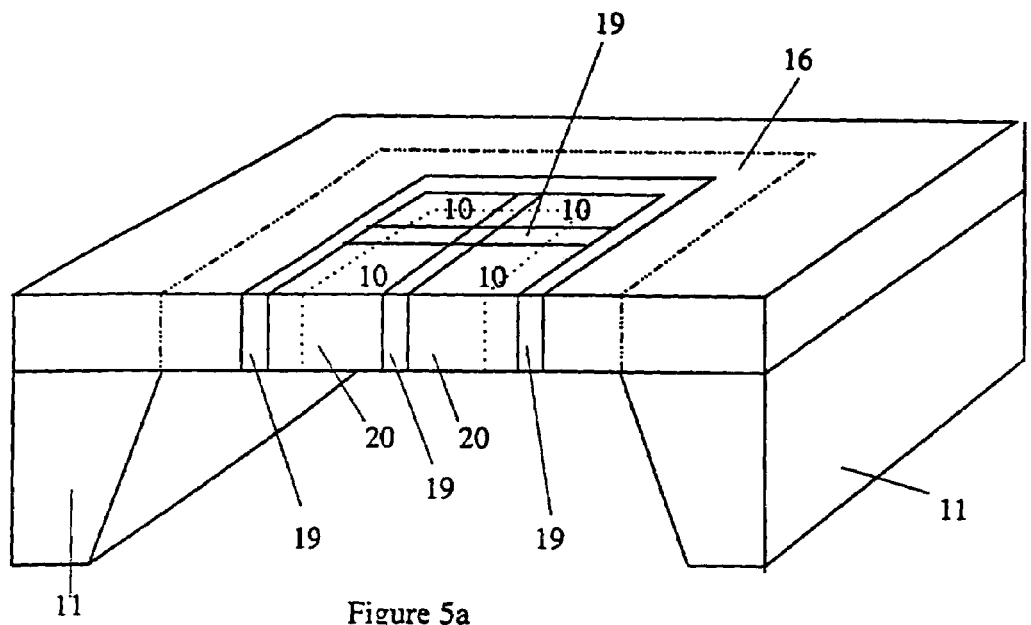
Figure 5B:
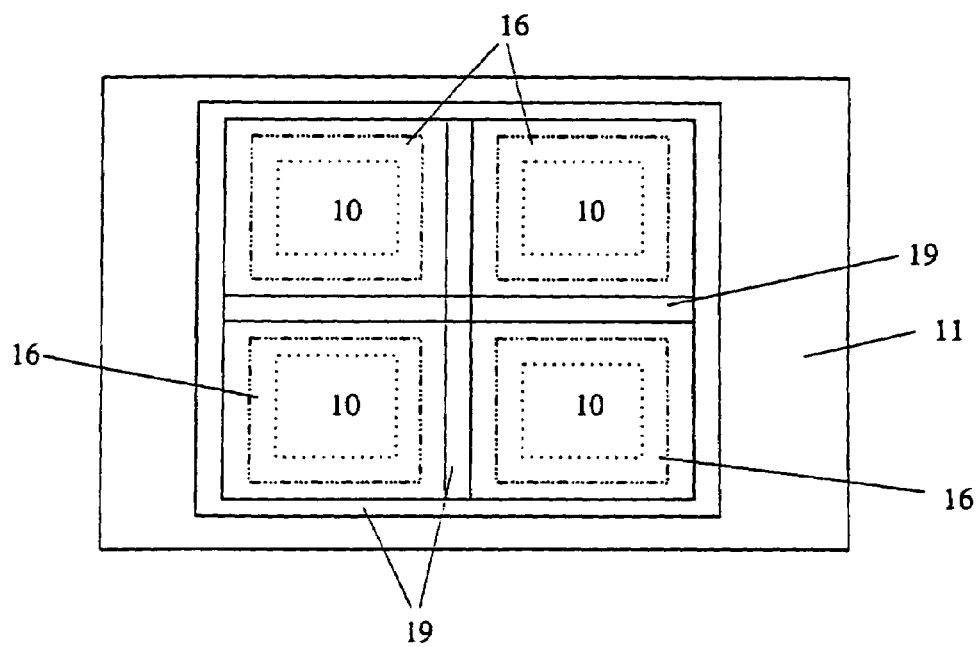
Figure 6A:
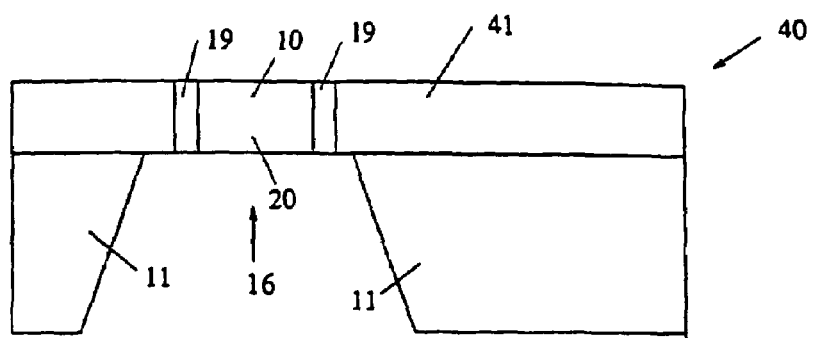
Figure 6B:
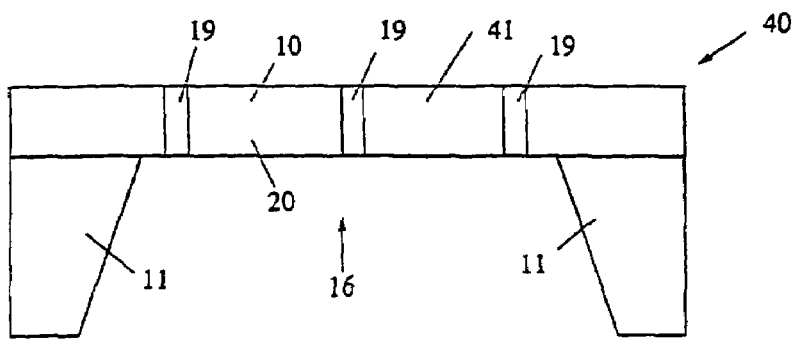
Figure 6C:
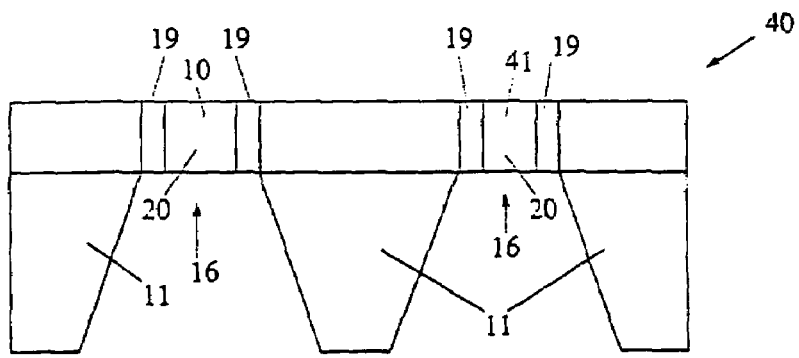
Figure 6D:
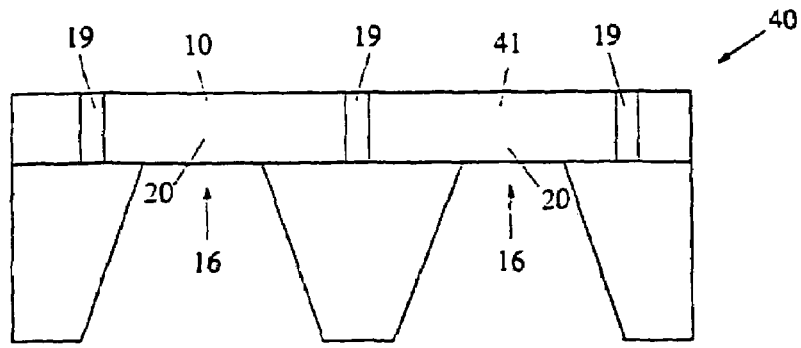

Several isolation layers 19 may be used within the same membrane 16 to separate plural power devices 10 placed within the same membrane 16 or to separate bipolar or CMOS low voltage devices from the power devices 10. Referring to FIG. 5a, there is shown an example of four such power devices 10 placed within the same membrane 16 and isolated from each other through isolation layers placed within the membrane 16. Referring to FIG. 5b, there is shown a top view of an example of four power devices 10 placed on separate respective membranes 16 and isolated from each other through isolation layers 19 placed outside the membranes 16. Referring to FIG. 6a, there is shown a schematic 2D cross-section of a power integrated circuit 40 which contains one membrane power device 10 and CMOS and bipolar devices 41 placed outside the membrane 16. Alternatively, the CMOS and bipolar devices 41 can also be placed on the membrane 16 together with the power devices 10 as shown in FIG. 6b or on different membranes 16 formed over the same original substrate 11 as shown in FIG. 6c. The example of FIG. 6d differs from the example of FIG. 6c in that the isolation layer 19 is placed outside the membranes 16. It is evident that the use of the membranes 16 and isolation layers 19 can provide a very effective electrical isolation between the power devices 10 and the low power circuits 41 as well as between adjacent power devices 10.

Figure 7:
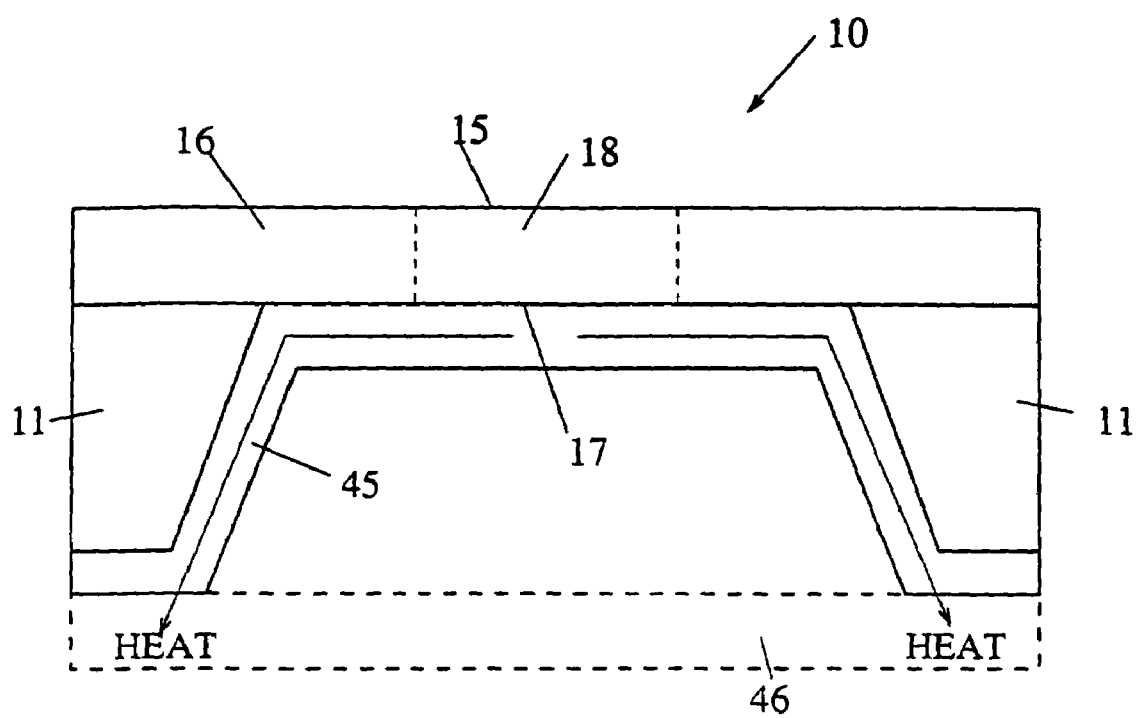
Figure 8:
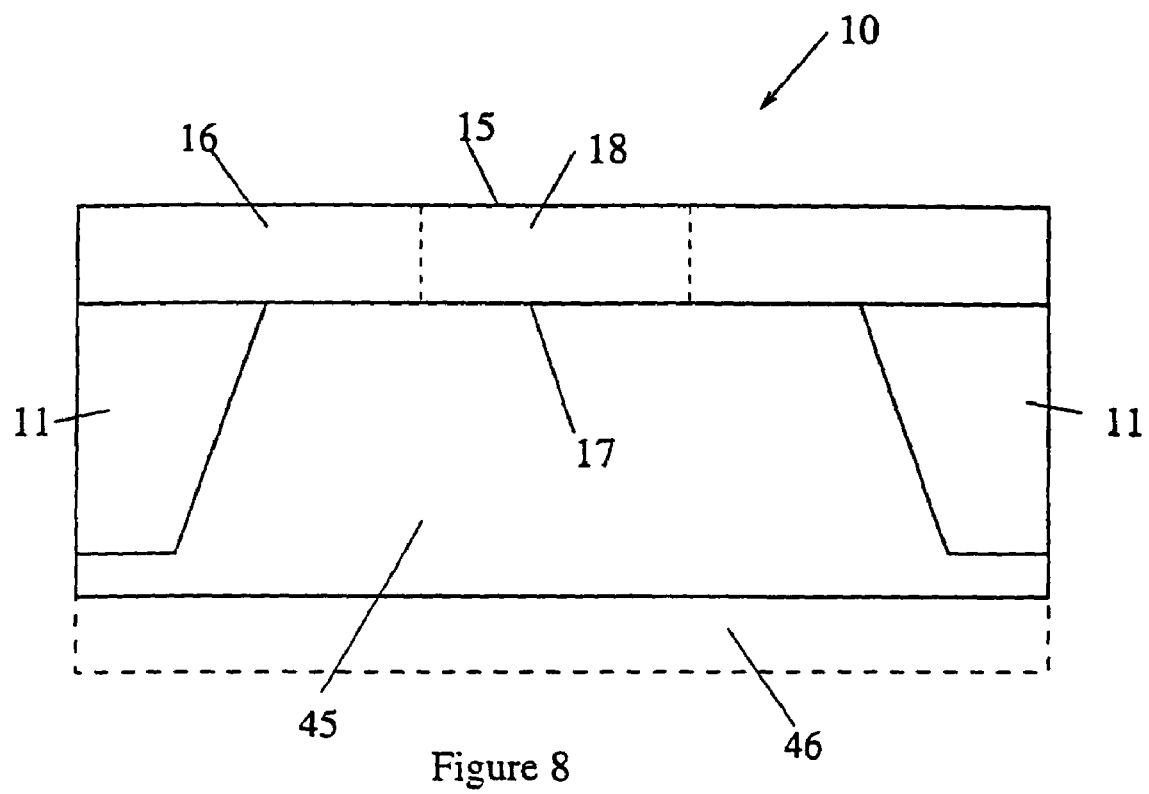

Referring now to FIG. 7, considering that all of the terminals are placed on the top surface 15 in this example, a layer 45 that is electrically insulating but which has a relatively high thermal conductivity may be placed adjacent the bottom surface 17 of the membrane 16 to help remove a large fraction of the heat which otherwise may be trapped inside the membrane 16 while the power device is operational. In the preferred embodiment, this layer 45 is formed after the single back-side etching of the semiconductor substrate 11 is carried out and may be in the form of a blanket deposition of a dielectric material with high thermal conductivity. Such material may be for example based on diamond. Other materials, such as boron nitride, aluminium nitride, and aluminium oxide, can be used. As shown in FIG. 8, the insulating layer 45 may fill the entire gap in the substrate 11 left by the membrane formation. In either case, a heat sink 46 may be in thermal contact with the insulating layer 45 to extract heat.

Figure 9A:
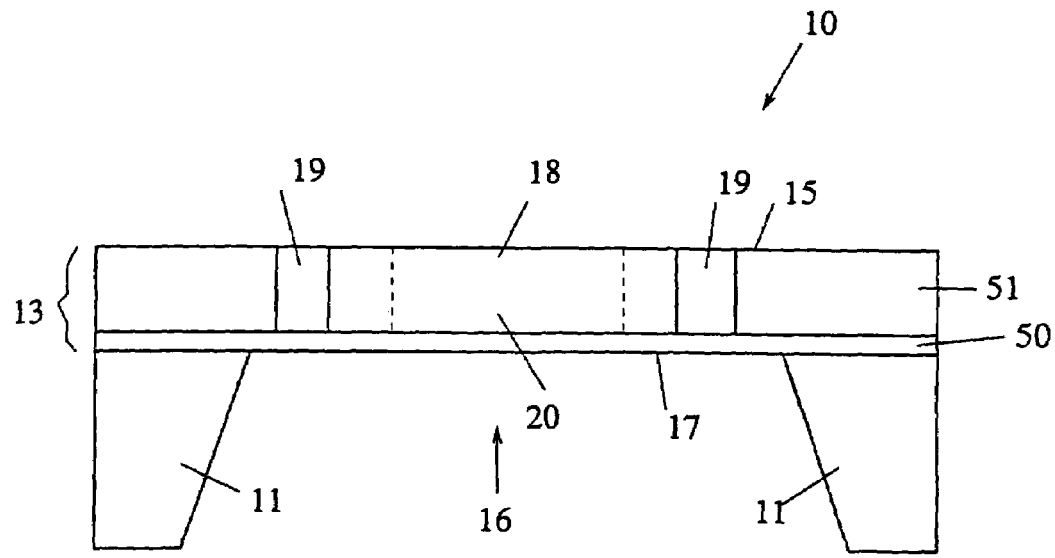
Figure 9B:
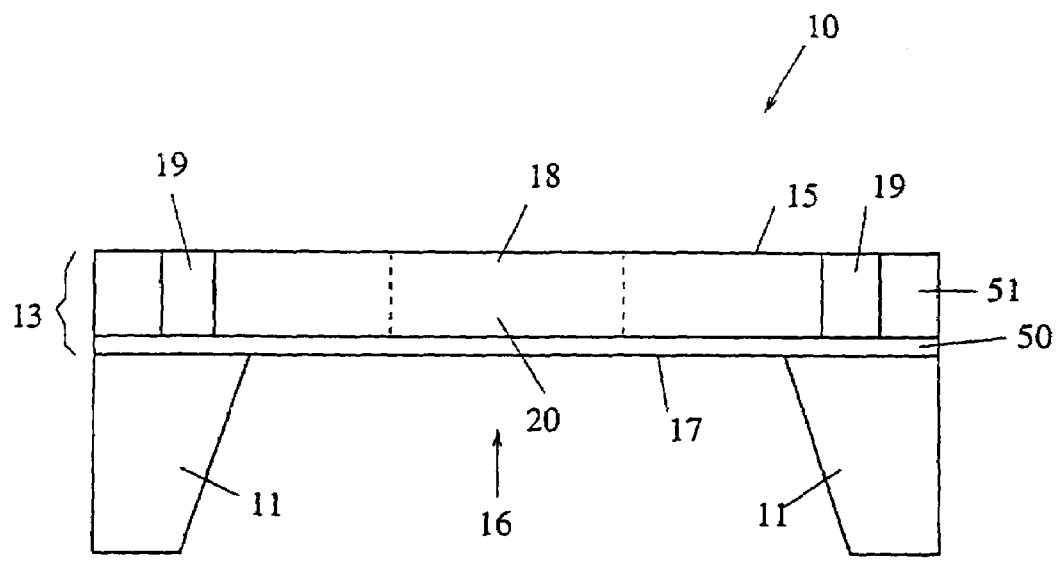

As shown in FIGS. 9a and b, the first thin layer 13 may comprise a thin insulating layer 50, the bottom of which effectively forms the membrane bottom surface 17, and at least one semiconductor layer 51 placed on top of the thin insulating layer 50, as known in for example state-of-the-art Silicon-on-Insulator (SOI) technology. In this case, an SOI technology such as bonding wafer, SIMOX or Unibond may be used in the fabrication of the power integrated circuits. Alternatively, silicon or diamond can be used. As one of the last steps of the high voltage SOI process, and as in the examples described above, the semiconductor substrate 11 below the buried insulating layer 50 may be partially removed through conventional patterning by single back-side etching. In this example, the buried insulating layer 50 acts as an effective etch stop to form the membrane 16. Importantly, when the main terminals are placed on the top surface 15 and within the membrane 16, the buried insulating layer 50 also helps achieve a uniform distribution of the potential lines inside the drift layer 20 such that the breakdown voltage of the membrane power device 10 will be close to its ideal value. In the example of FIG. 9a, the isolation layer 19 is placed within the membrane 16. In the example of FIG. 9b, the isolation layer 19 is provided outside the membrane 16.

Figure 10A:
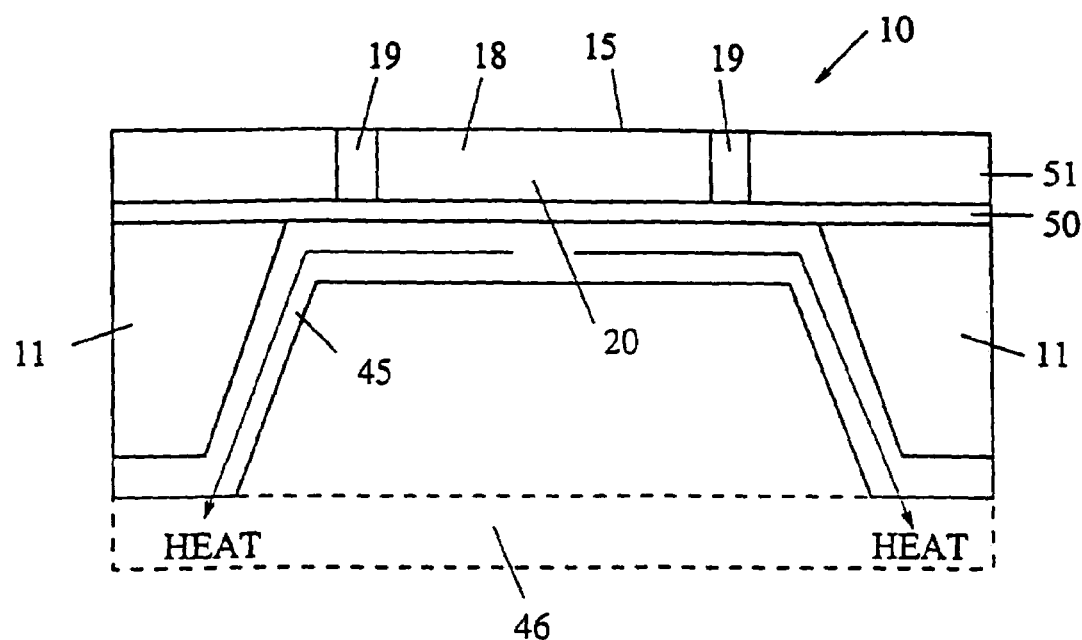
Figure 10B:
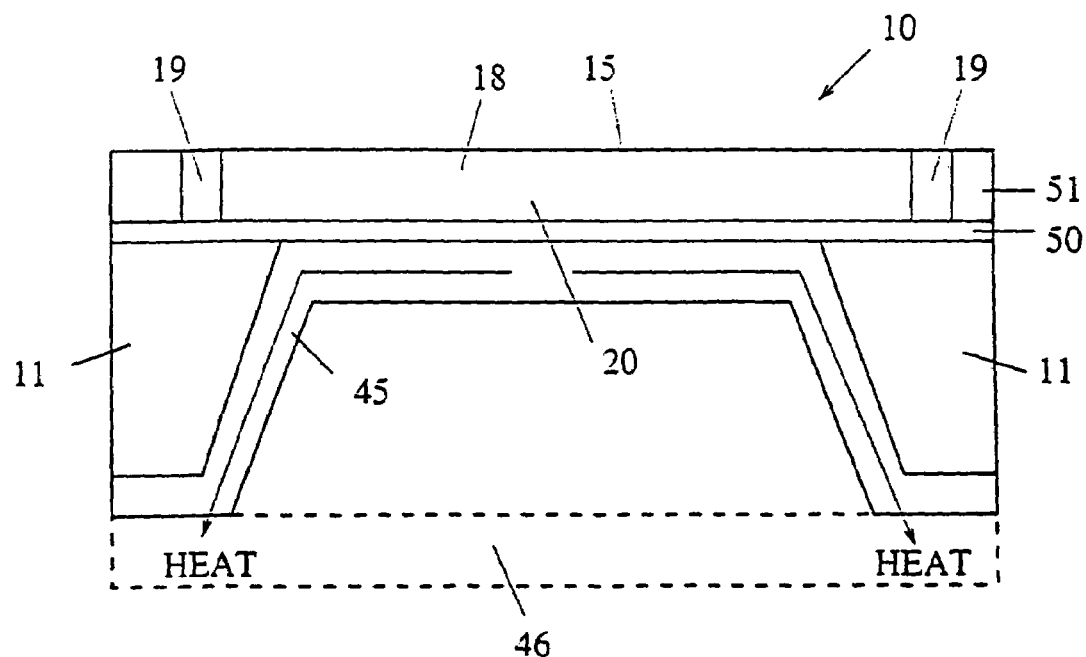
Figure 11A:
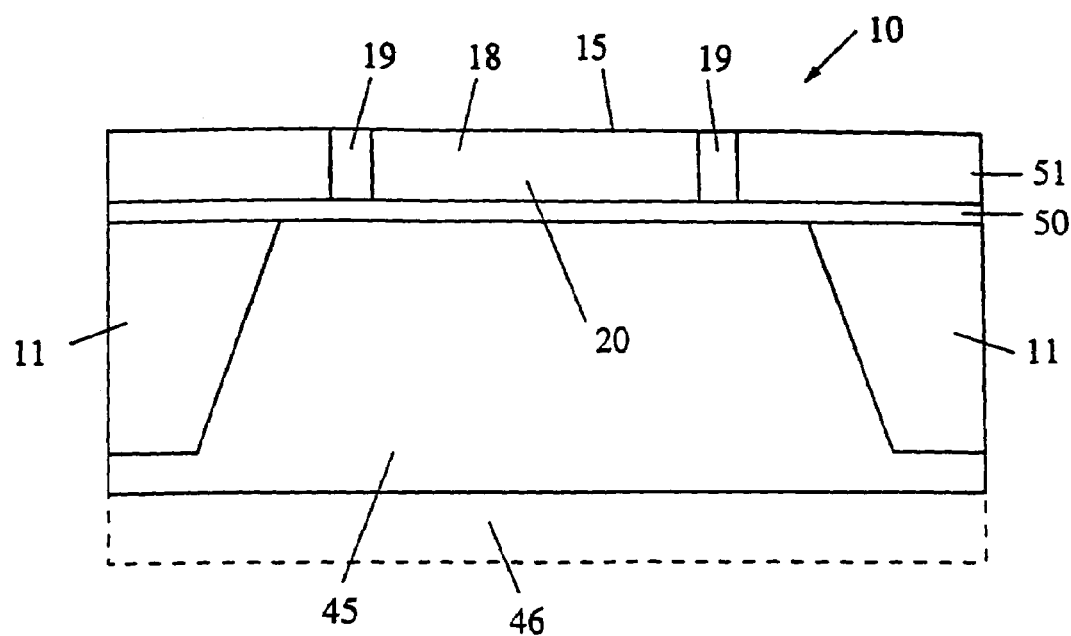
Figure 11B:
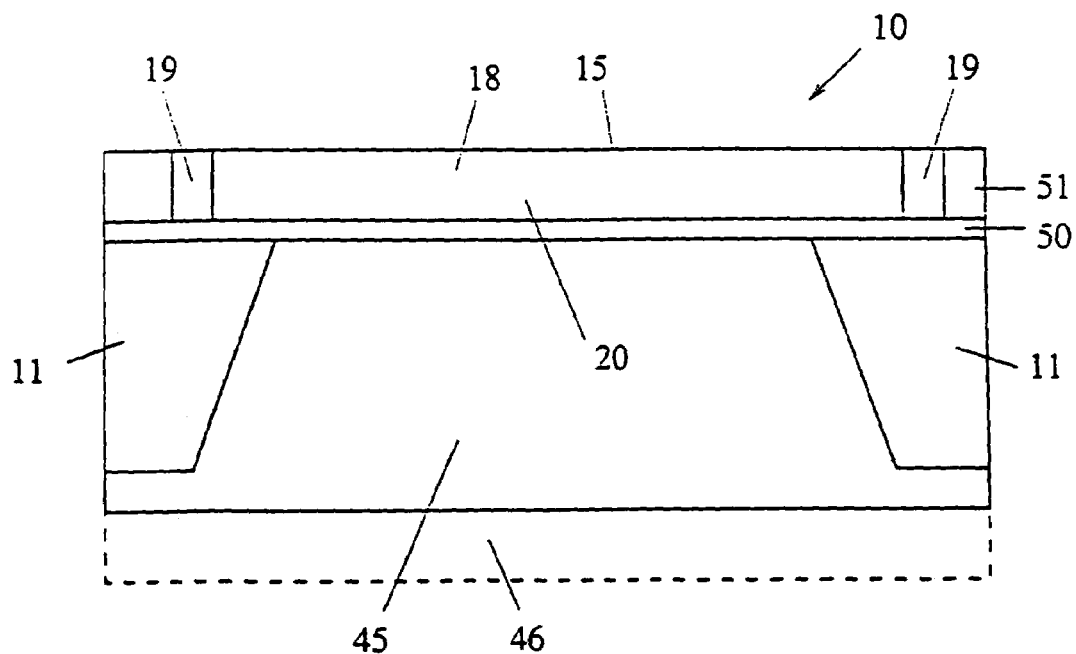

Again, an insulating layer 45 with relatively high thermal conductivity may be formed below the membrane 16 as shown in FIGS. 10 and 11 to help remove the heat laterally to the substrate 11 and/or directly to an external heat sink 46. In the examples of FIGS. 10a and 11a, an isolation layer 19 is provided within the membrane 16 whereas in the examples of FIGS. 10b and 11b, an isolation layer is provided outside the membrane 16.

Figure 12:
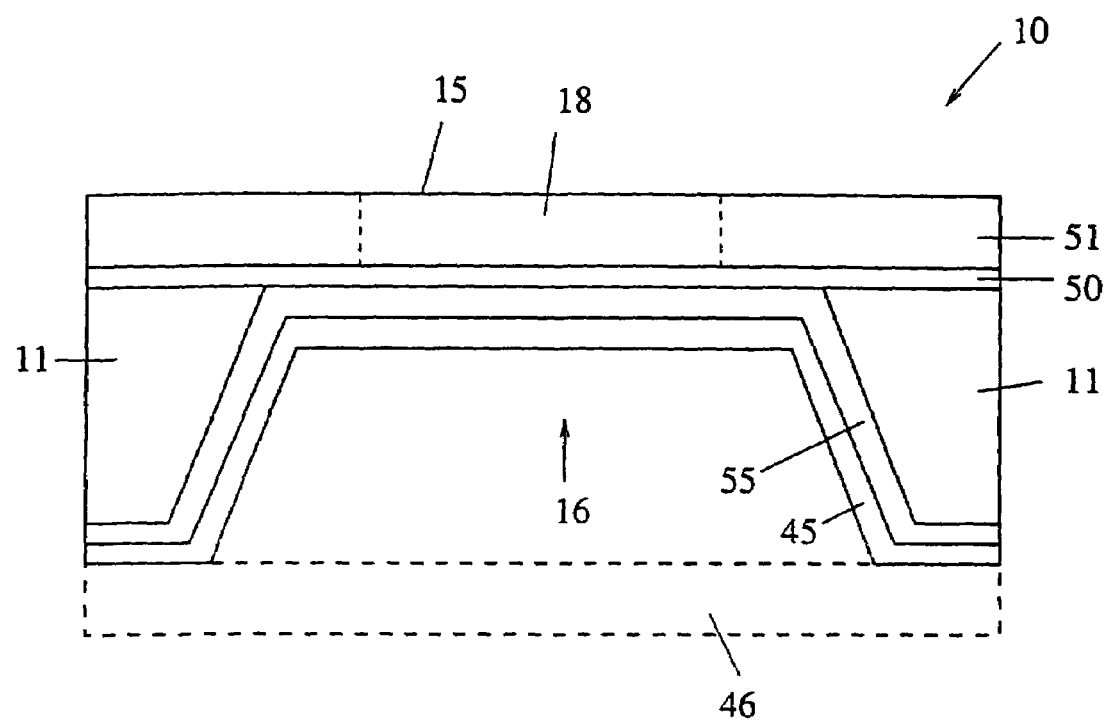

In the example shown in FIG. 12, a further electrically insulating layer 55 with enhanced mechanical properties is placed between the buried insulating layer 50 and the electrically insulating but thermally conductive layer 45 in the region of the membrane 16 in order to strengthen the structure of the membrane 16 and help minimise the risk of mechanical rupture of the membrane 16. This additional insulating layer may also help to compensate the overall mechanical stress in the membrane 16 and may also enhance the adhesion of the electrically insulating but thermally conductive layer 45 to the buried insulating layer 50. It will be appreciated that this mechanically strong layer 55 can also be placed under the membrane 16 in any of the other examples described in this specification that do not have the buried insulating layer 50, such arrangement enhancing the electrical (passivation and/or mechanical performance of the structure including particularly the resistance to rupture. Several such mechanically strong insulating layers can be deposited on the back side of the membrane 16 to increase the thermal dissipation, passivate electrically and/or consolidate mechanically the membrane 16 and/or to act as buffer layers to achieve good adhesion between one layer and another. The insulating layers 21 and buffer layer may be nitrides, oxides, amorphous materials or polycrystalline materials.

Figure 13A:
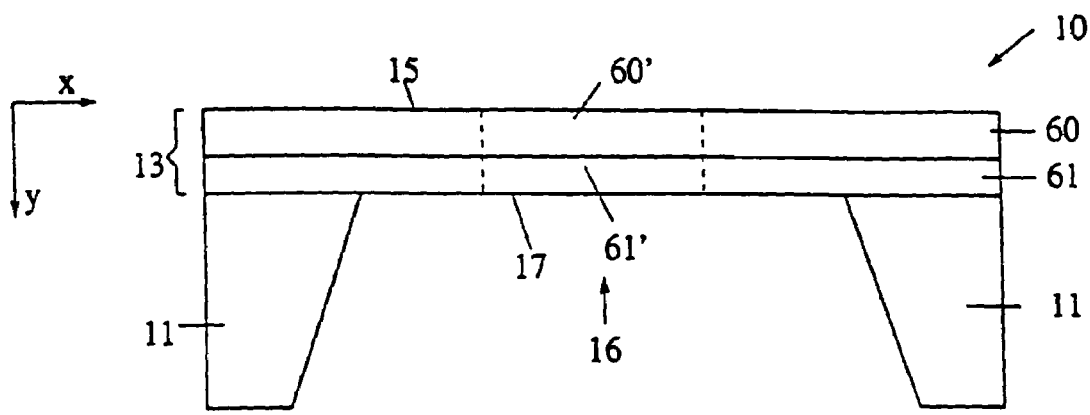
Figure 13B:
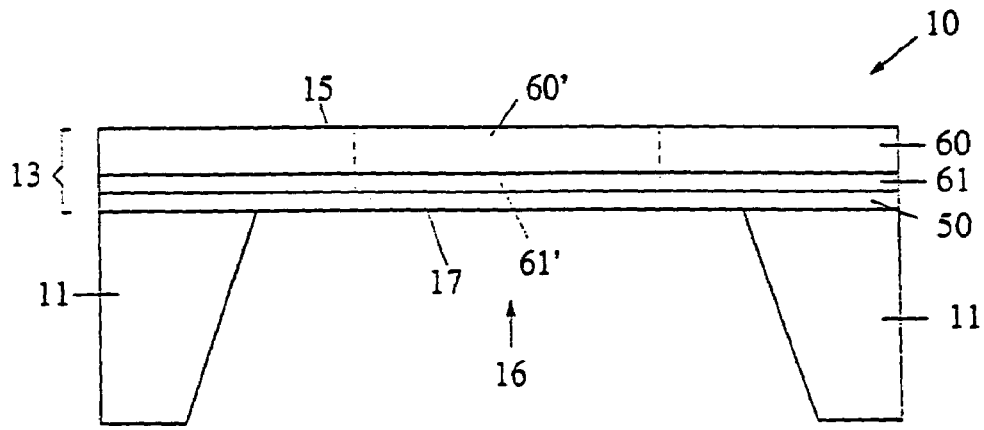
Figure 13C:
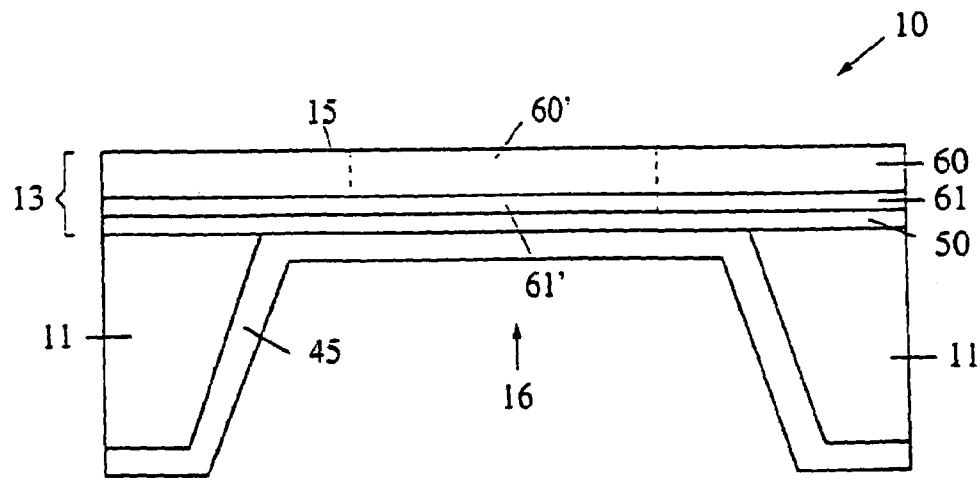
Figure 14A:
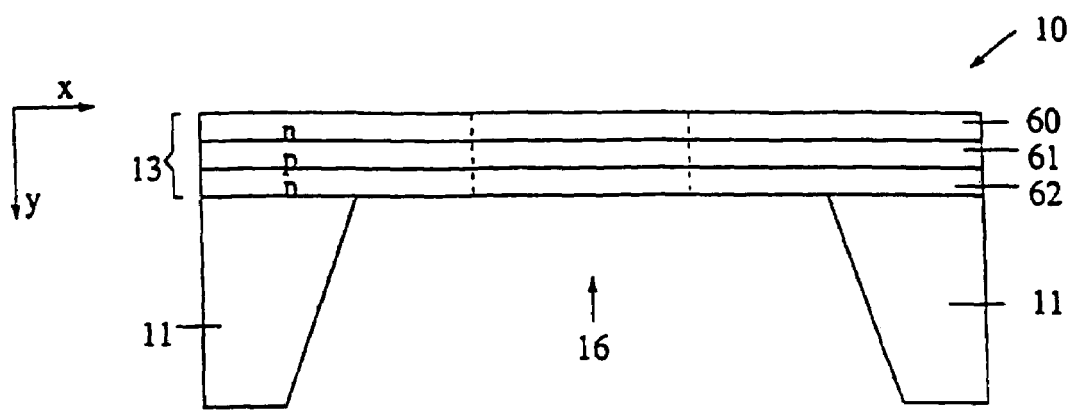
Figure 14B:
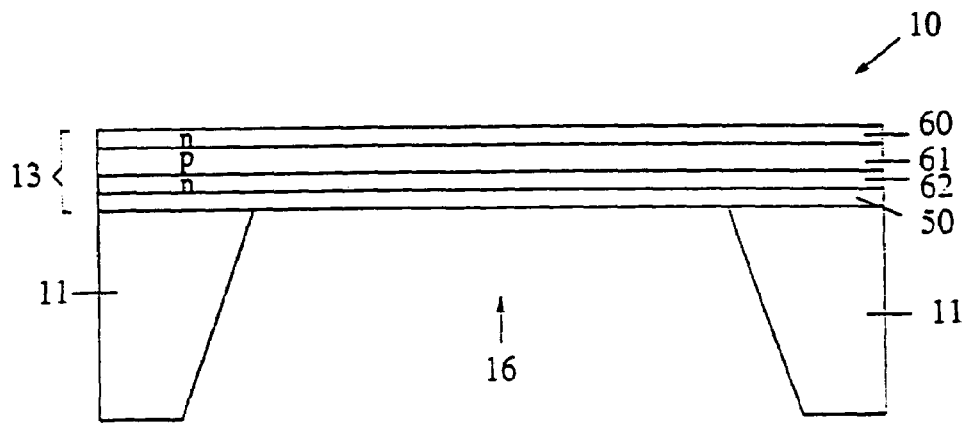
Figure 14C:
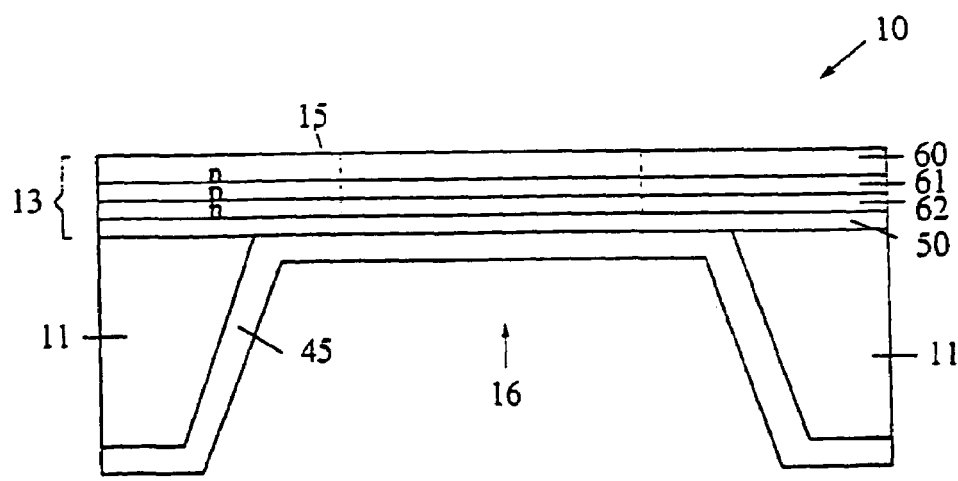

In the examples shown in FIGS. 13a to 13c, when the main device terminals are placed on the top surface 15 and within the membrane 16, the first thin layer 13 in each case comprises two semiconductor layers 60,61 of opposite conductivity type such that the drift region in the power device 10 is now comprised of two semiconductor regions 60',61' of opposite conductivity type placed above and in direct contact with each other to form a semiconductor junction. The presence of these two semiconductor regions 60',61' of different conductivity type and in direct contact can significantly increase the breakdown voltage of the device. This is due to the horizontal junction formed in the vertical direction between the semiconductor layers 60,61 which facilitates the depletion of the entire drift region at much lower voltage than the breakdown voltage. This means that the drift region acts physically as an intrinsic layer during the voltage blocking mode and the potential lines in a vertical cross-section of the device are perpendicular to the top surface 15 and the membrane bottom surface 17 and more evenly distributed along the drift region in the lateral direction. For these structures, the electric field is therefore practically uniform along the drift region in the lateral or x direction. If the electric field reaches its critical value, avalanche breakdown occurs. As the electric field at this point is substantially uniform, the breakdown voltage, which is graphically represented by the area under the electric field curve in the x direction between the main terminals of the device, is a maximum. It will be understood that the doping concentration and the thickness of the two semiconductor layers 60,61 each play an important role in obtaining the maximum breakdown voltage possible and are preferably selected such that the entire drift region is depleted at relatively low voltage compared to the rated breakdown voltage. The choice of doping concentration and thickness of the two semiconductor layers 60,61 is also influenced by the type of power device employed and by the associated fabrication process.

The example shown in FIG. 13*b* is of the SOI type having a silicon oxide insulating layer 50. The example of FIG. 13*c* is again of the SOI type having a silicon oxide insulating layer 50 and an electrically insulating but thermally conductive layer 45 deposited on the back side of the insulating layer 50. It will be appreciated that an electrically insulating but thermally conductive layer can also be deposited on the bottom surface 17 of the membrane 16 of the JI example shown in FIG. 13*a*.

In the examples shown in 14*a* to 14*c*, which correspond generally to the examples shown in FIGS. 13*a* to 13*c*, the drift region in each case is formed by several semiconductor layers of alternating conductivity type built on top of each other in the y direction such that the entire drift region becomes completely depleted at relatively low voltage compared to the rated breakdown voltage. Again, it will be appreciated that an electrically insulating but thermally conductive layer 45 can be deposited on the bottom surface 17 of the membrane 16 of any of these examples.

Figure 15:
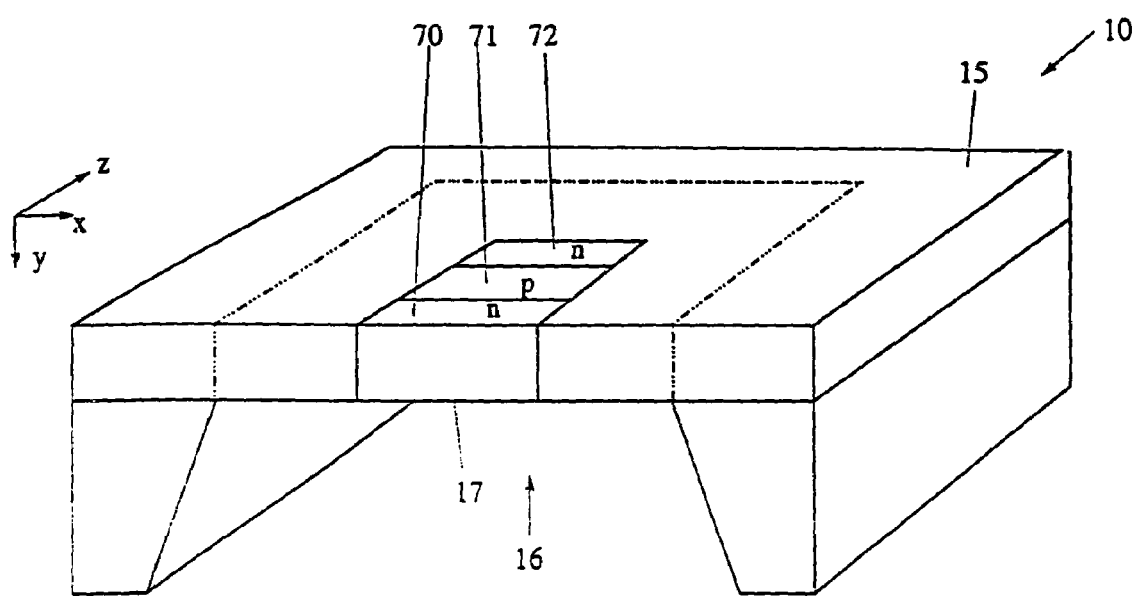

In the example shown in FIG. 15, when again the main terminals are placed on the top surface 15 within the membrane 16, the drift region of the membrane power device 10 comprises plural adjacent layers 70,71,72 of alternating conductivity type arrayed in the third dimension z. These adjacent semiconductor regions in the z direction form transverse semiconductor junctions in the z direction such that the entire drift region becomes completely depleted at relatively low voltage compared to the rated breakdown voltage. The presence of the vertical junction planes on the membrane 16 results in an even distribution of the potential lines along the drift region in the x direction, which increases the breakdown voltage to be close to the ideal value. As in the examples described above, the potential lines in a vertical (x,y) cross-section of the device are perpendicular to the top surface 15 and the membrane bottom surface 17 and are thus aligned to the y axis. The doping and the thickness of the adjacent semiconductor layers 70,71,72 of different conductivity type are selected such that the drift region depletes entirely in the voltage blocking mode at relatively low voltage compared to the rated breakdown voltage, thus increasing the breakdown voltage close to its ideal value. It will be understood that whilst three semiconductor layers 70,71,72 are shown arrayed in the z direction, just two or more than three such layers may be employed. It will further be understood that an electrically insulating but thermally conductive layer may be deposited on the bottom surface 17 of the membrane 16 in order to extract heat from the device 10.

Figure 16:
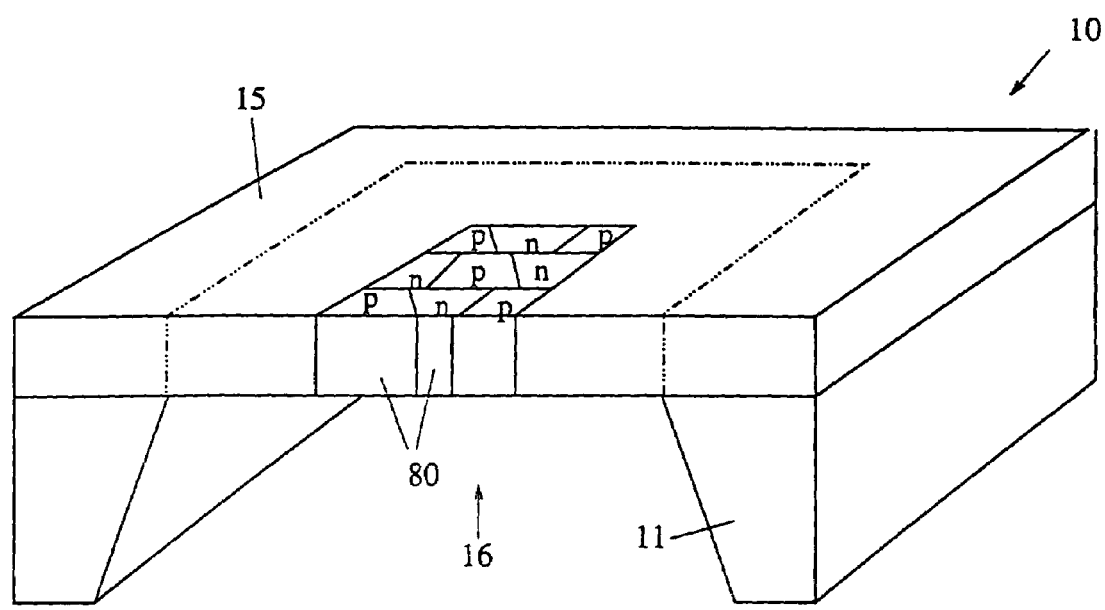

In the example shown in FIG. 16, the drift region is formed by several cells 80 of different conductivity type placed alternately to each other to form at the top surface 15 and in the x,z plane regular patterns such that again the entire drift region becomes completely depleted during the voltage blocking mode so that the potential is distributed uniformly across the drift region. The cells of different conductivity type may be formed regularly as shown or irregularly (not shown) in the x,y plane.

Figure 17A:
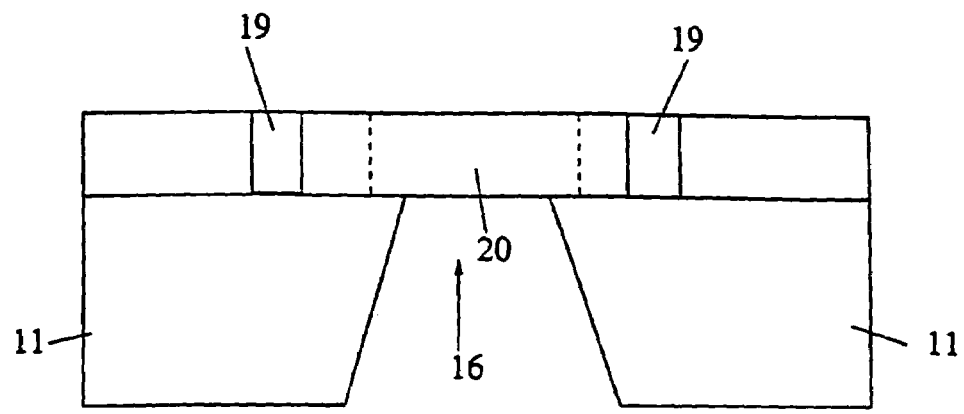
Figure 17B:
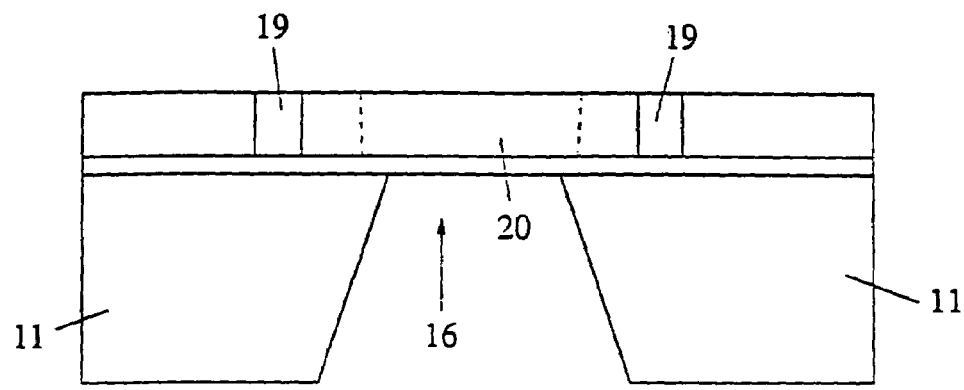
Figure 17C:
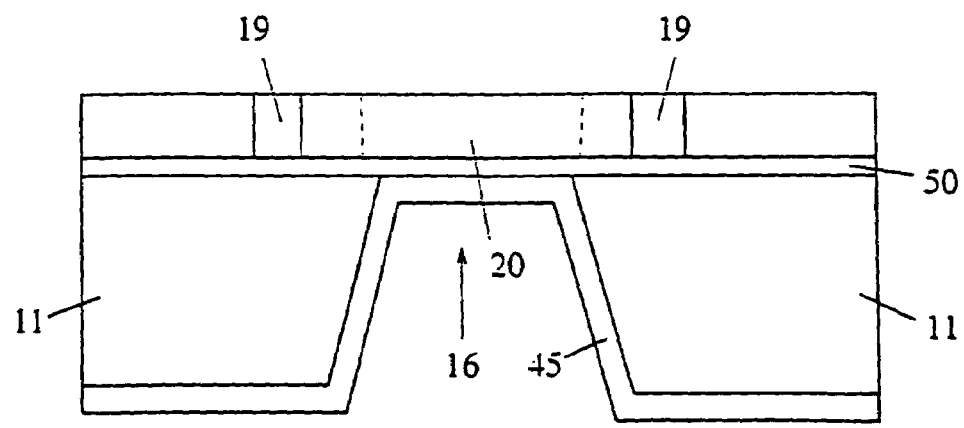

In the examples shown in FIGS. 17*a* to 17*c* (which show respectively a JI device, a SOI device, and a SOI device having an electrically insulating but thermally conductive layer 45 applied to the back of the membrane 16), the substrate 11 is removed such that only a part of the drift region 20 lies within the membrane 16. Thus, part of the drift region 20 remains outside the membrane 16 (and is therefore positioned above the remaining part of the substrate 11). The main terminals are placed on the top surface 15 but, preferably, the high voltage terminal end of the drift region 20 is located within the membrane 16 whilst the low voltage terminal end of the drift region 20 may remain outside the membrane 16. Again, it will be appreciated that an electrically insulating but thermally conductive layer 45 can be deposited on the bottom surface 17 of the membrane 16 of any of these examples.

In all of the examples described above and shown in FIGS. 2 to 17, the walls of the substrate 11 are angled to the x,z plane of the lateral device. This is because the most common technique for back side etching is wet anisotropic etching, which is typically performed using a KOH solution. The silicon substrate 11 is a mono-crystal and the etching rates of anisotropic etchants is dependent on the crystal orientation. The etch-stop planes are usually the (111) planes. Those devices of the SOI type that have the buried oxide layer have the advantage that the back side etch stops automatically at the buried oxide since the etch of the oxide is for many etchants (including KOH) much slower than that of silicon. Alternatively, for bulk silicon (i.e. non-SOI) devices, the back side etch can be controlled in time or electrochemically.

Figure 18A:
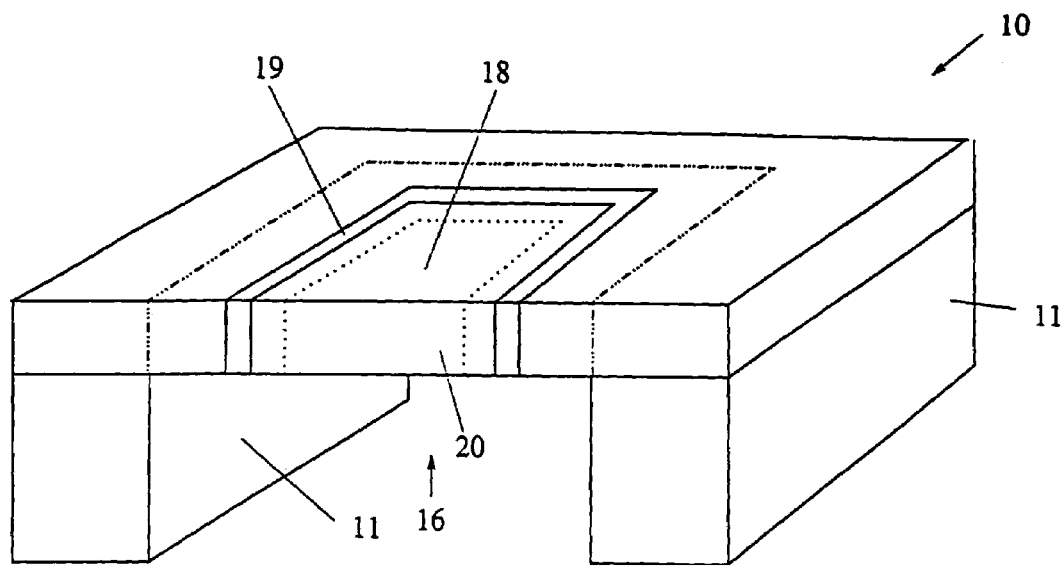
Figure 18B:
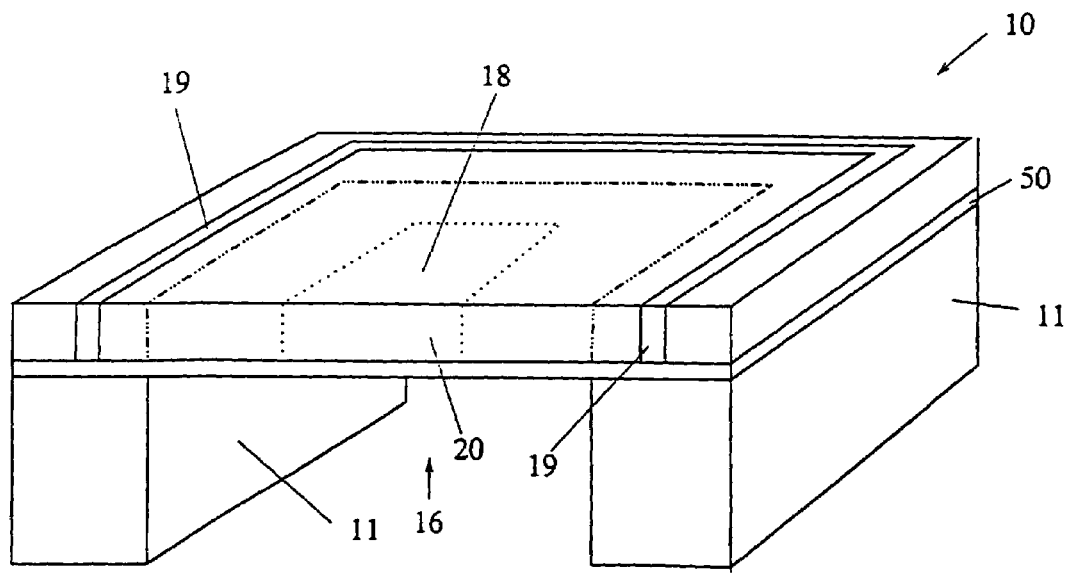

Instead of wet anisotropic etching, dry back side etching may be used for producing any of the membrane power devices according to the present invention. Dry back side etching has the advantage that the walls of the substrate 11 are vertical, as shown by way of example in FIGS. 18 and 18*b*. This means that the volume occupied by the gap in the substrate 11 below the membrane 16 is no longer dependent on the thickness of the substrate 11 and thus a plurality of membranes 16 with reduced lateral spacing between them can be achieved in the same chip or integrated circuit more easily. In the example of FIG. 18*a*, the isolation layer 19 is provided within the membrane 16 whereas in the example of FIG. 18*b*, the isolation layer 19 is provided outside the membrane 16.

Figure 19:
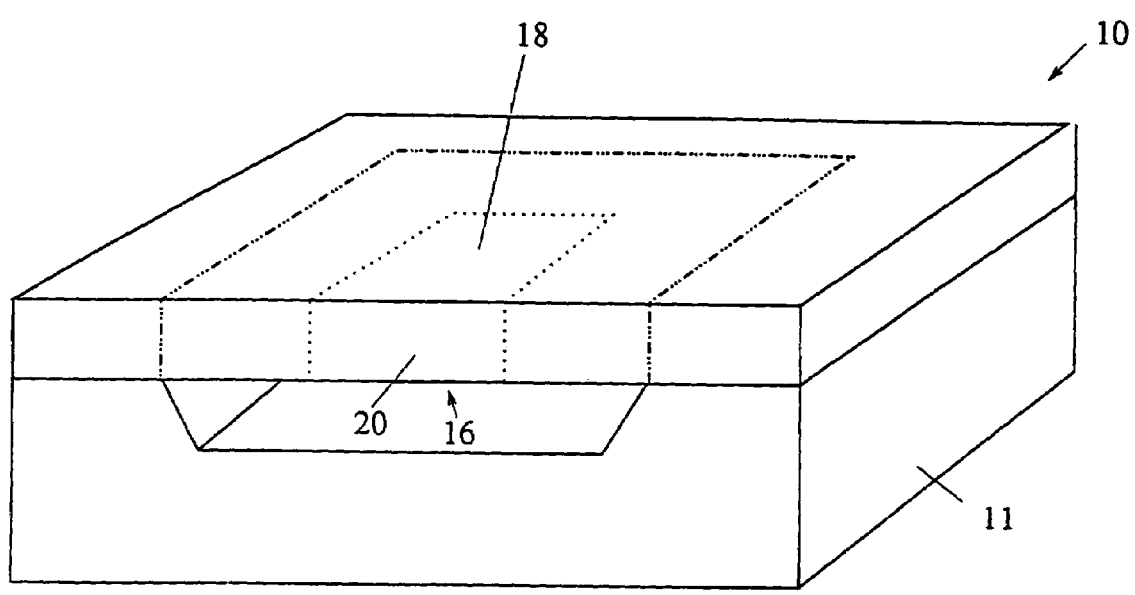
Figure 20:
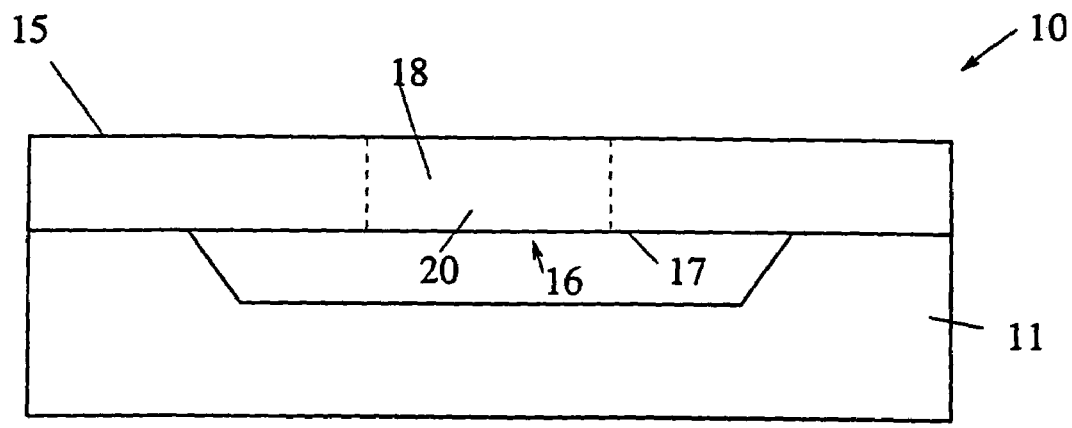
Figure 21:
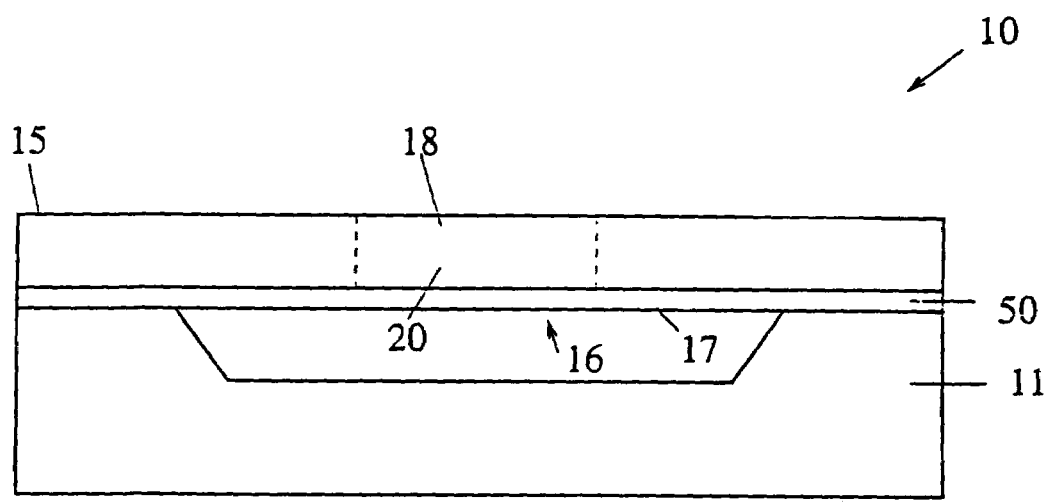

In the example shown in FIG. 19, the membrane 16 is formed by front side etching (i.e. surface micro machining) of the substrate 11. In the example shown, the substrate 11 is only partly removed below the active region 18 of the device 10 so as to leave a gap in the substrate 11 below the active structure 18 which helps to increase the breakdown capability of the device. FIG. 20 is a cross-sectional view of the example of FIG. 19. FIG. 21 shows a SOI variant of the example of FIGS. 19 and 20. As in all of the examples described above, the presence of the gap in the substrate 11 below the active region 18 (i.e. the formation of the membrane 16) means that the potential lines in the drift region 20 are perpendicular to both the top surface 15 of the device and the bottom surface 17 of the membrane and are substantially uniformly distributed inside the drift region 20 such that the breakdown voltage approaches its ideal limit.

Figure 22A:
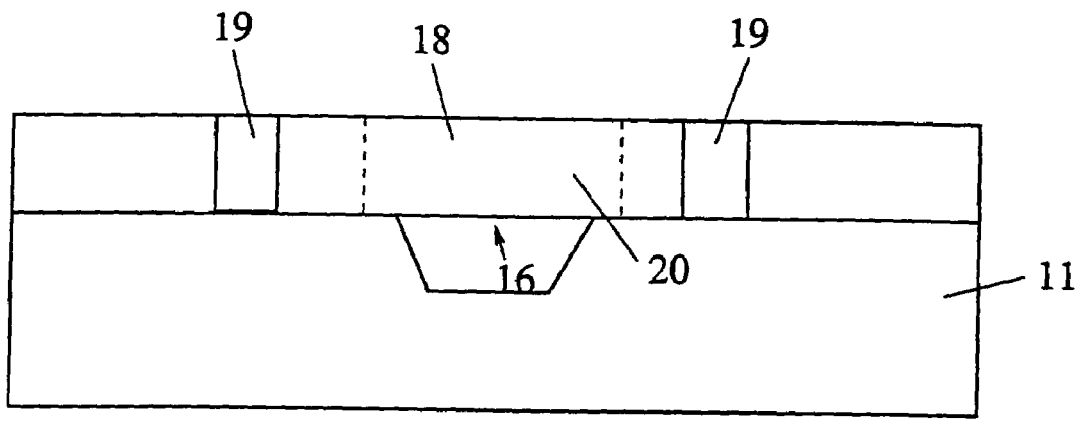
Figure 22B:
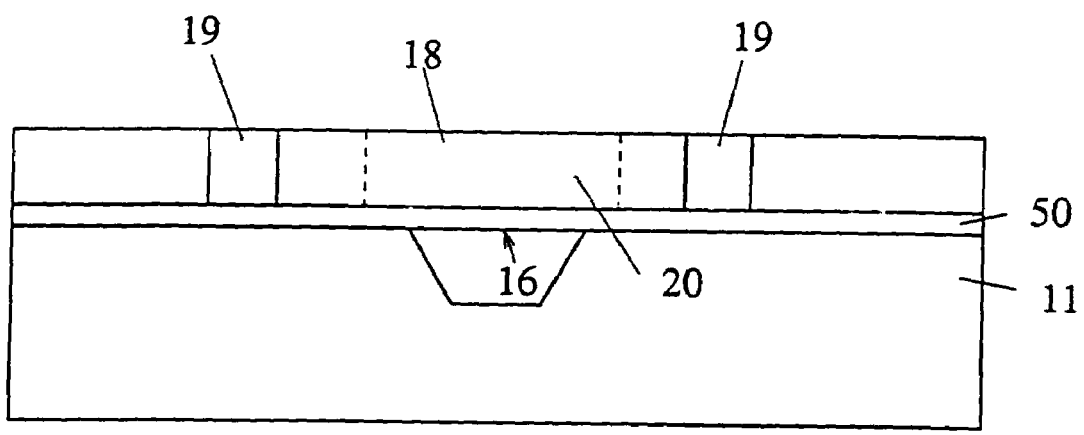

In the examples shown in FIGS. 22*a* and 22*b*, which are respectively JI and SOI variants, the gap in the substrate 11 is formed only partially under the drift region 20 such that only a part of the drift region 20 is formed in the membrane 16. Again, the main terminals are placed on the top surface 15 but preferably the high voltage terminal end of the drift region 20 is placed within the membrane 16 whilst the low voltage terminal end may remain outside the membrane 16.

Figure 23A:
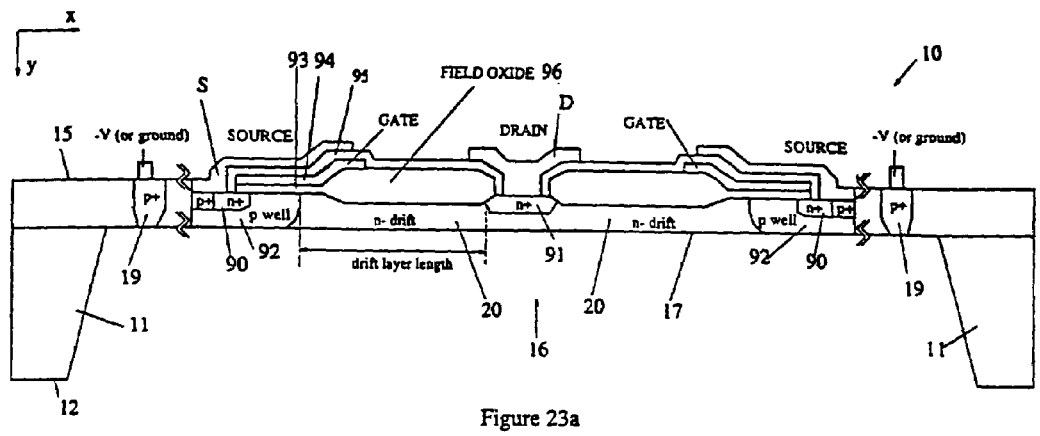
Figure 24:
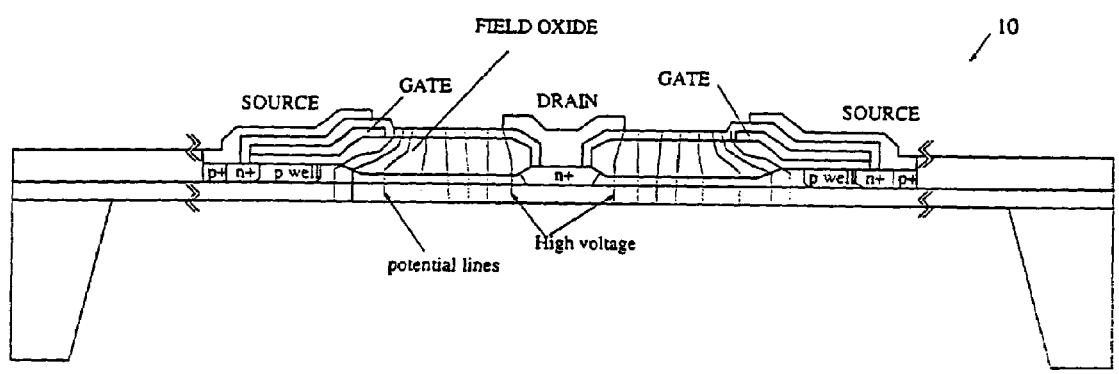

FIG. 23*a* shows in detail an example of a membrane high voltage lateral DMOSFET (LDMOSFET) 10 according to the present invention in which the drift region 20 is of n conductivity type, the source region 90 and the drain region 91 are of n conductivity type and very well doped with donor impurities to form a good ohmic contact, and the p well 92 is of p conductivity type. A conventional insulated gate formed by a thin insulated layer 93 and a polysilicon and/or metal layer 94 is placed above the p well 92 and isolated from the source metal layer S by an insulation layer 95. A thicker insulating layer 96, referred to as the field oxide, may be present at the top of the drift layer 20 between the insulated gate and the drain region. The polysilicon/metal layer 94 may extend by a short distance above the field oxide 96. In the on-state, current flows between the drain terminal D which contacts the n+ drain region 91 and the source terminal which contacts the n+ source region 90. This current is controlled by the potential applied to the gate terminal G which contacts the insulated gate. When a higher potential is applied to the gate terminal with respect to the source terminal, a channel of electrons is formed at the surface of the p well 92 under the insulated gate which allows flow of electrons from the source region, through the channel, via the drift region 20 to the drain. The device can be turned on and off by applying an appropriate potential to the gate terminal. The high voltage LDMOSFET is placed on a membrane 16 defined by the top surface 15 and the membrane bottom surface 17. The membrane bottom surface 17 is situated in the y direction of the cross section between the top surface 15 and the semiconductor substrate surface 12. The membrane 16 is therefore thin in comparison with the semiconductor substrate 11 such that when the device operates in the voltage blocking mode, the drift region 20 becomes completely depleted of mobile carriers and the potential lines are virtually perpendicular to the top surface 15 and the bottom membrane surface 17 as shown in FIG. 24. This is in contrast with prior art JI LDMOSFETs in which the drift region is conventionally placed above a thick semiconductor substrate which in the off-state is not completely depleted and therefore the potential lines bend from the initial vertical direction in the drift region to align with the horizontal direction (x axis) within the substrate. The advantage of the high voltage membrane LDMOSFET resides in higher breakdown voltage capacity, a more uniform distribution of the potential lines at the surface and a better isolation through the use of a vertical isolation layer 19 in the membrane 16. In this example, the isolation layer 19 is made of a highly doped p+ layer and is connected to the source terminal. It should be understood that the device shown in FIG. 23*a* may typically contain several stripes/fingers/cells such that the device meets the current level and power specifications. For a 600 V device, the drift region doping concentration may typically be $10^{16}/cm^3$, the thickness of the drift region 20 between 0.2 to 20 μm, and the length of the drift region 30-50 μm. The doping of the drift region 20 need not be constant and can vary from the source end to the drain end. For example, at the source end the doping may be $8 \times 10^{15}/cm^3$ while increasing linearly to $3 \times 10^{16}/cm^3$ at the drain end.

Figure 23B:
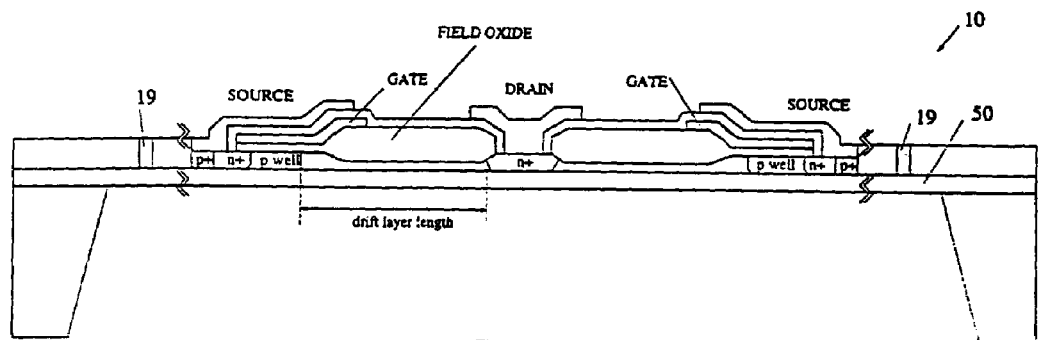
Figure 23C:
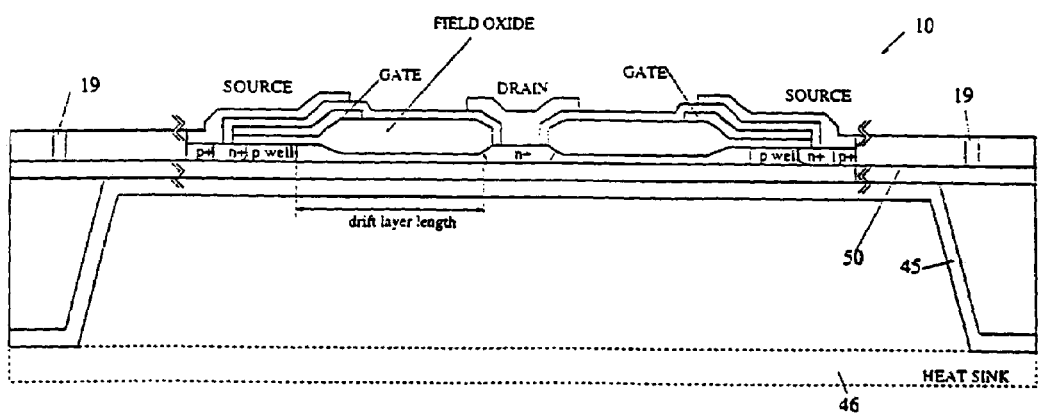

FIG. 23*b* shows an SOI variant of the example of FIG. 23*a* in which an insulating layer 50 is placed at the bottom of the drift region 20 as part of the membrane 16. This insulating layer 50 need not be thick as in the case of prior art SOI high voltage devices but may instead be very thin since the potential in the voltage blocking mode (when the device is off) is not supported across it in the y direction (as in the case of conventional SOI high voltage devices) but instead along it, in the x direction. The isolation in this case is made by trench oxides 19 but other types of isolations, such as p+ layer, may be used. FIG. 23*c* shows a variation of the example of FIG. 23*b* in which an electrically insulating layer 45 with a good thermal conductivity is placed below the membrane to facilitate the removal of heat to a heat sink 46 and thus avoid excessive self-heating. In this example, the isolation layer 19 is provided outside the membrane 16.

Again, it will be appreciated that an electrically insulating but thermally conductive layer 45 can be deposited on the bottom surface 17 of the membrane 16 of any of these examples.

Figure 25A:
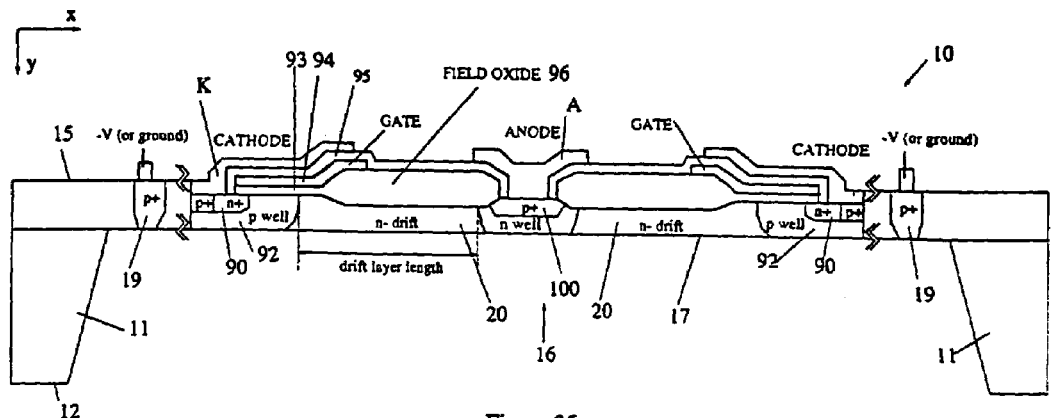
Figure 25B:
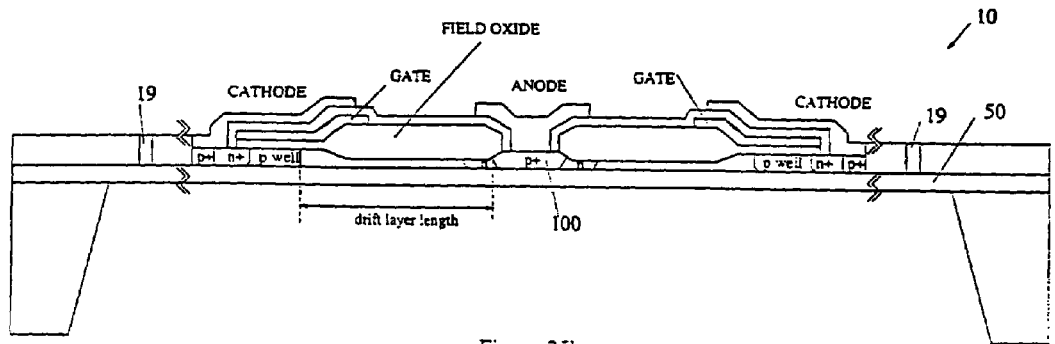
Figure 25C:
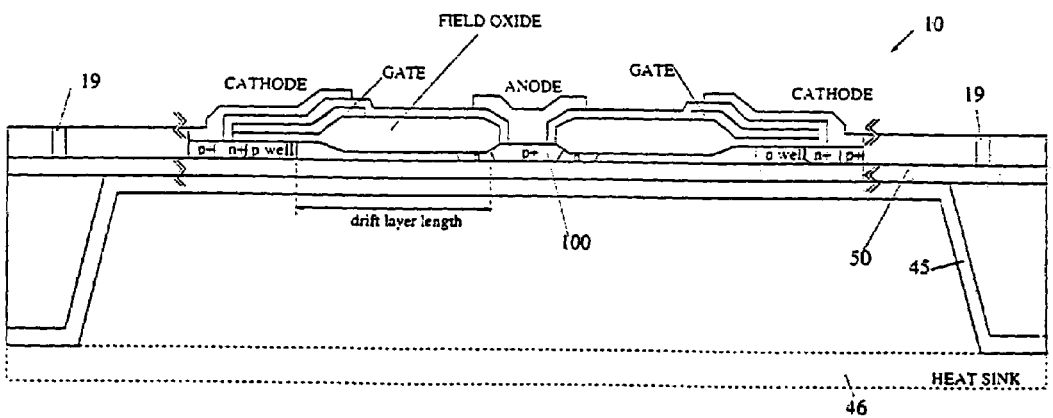

FIGS. 25*a* to 25*c* show in detail examples of Lateral Insulated Gate Bipolar Transistor (LIGBT) membrane power devices in which bipolar current conduction within the drift region 20 on the membrane 16 is employed and which correspond generally to the LDMOSFETs shown in FIGS. 23*a* to 23*c*. The main difference between the LIGBT membrane power devices and the LDMOSFET power devices shown in FIGS. 23*a* to 23*c* is the use of a highly doped p-type hole injector layer 100 at the anode. Bipolar conduction in LIGBT type devices is characterised by conductivity modulation in the drift layer in order to reduce the on-state resistance. Again, it will be appreciated that an electrically insulating but thermally conductive layer 45 can be deposited on the bottom surface 17 of the membrane 16 of any of these examples.

Figure 26A:
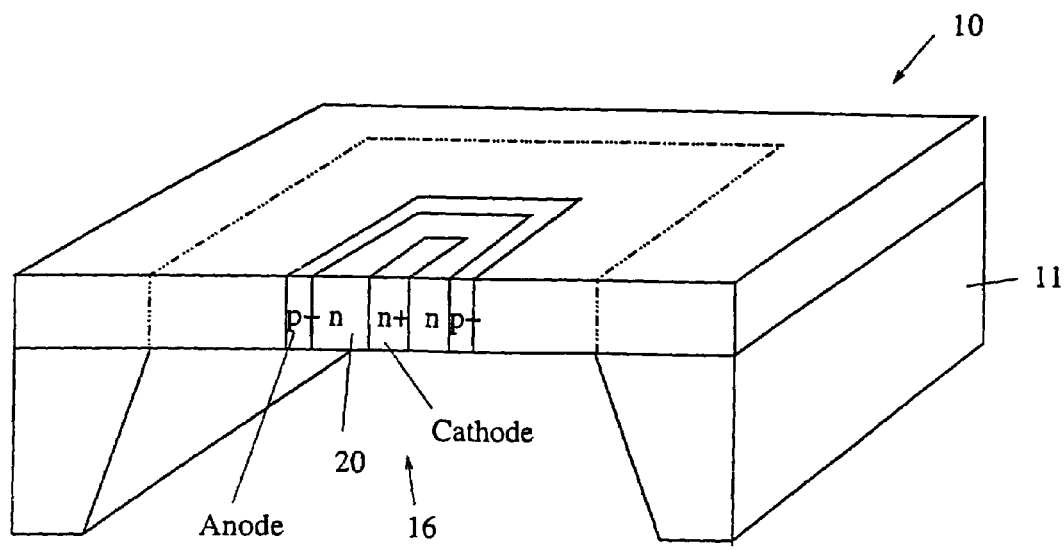
Figure 26B:
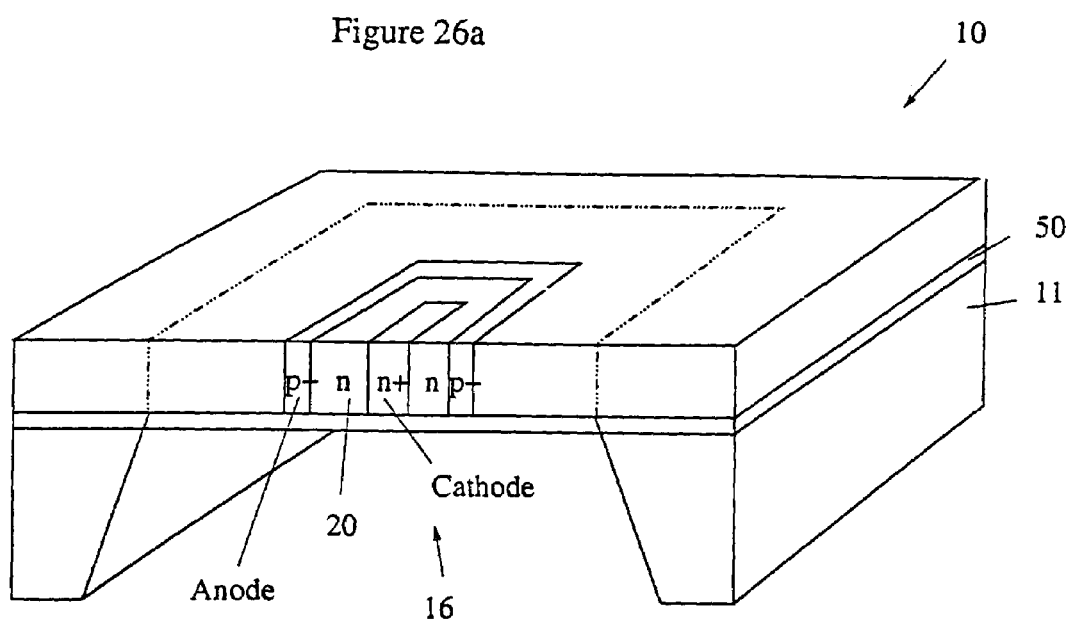

FIG. 26*a* is a schematic perspective view of an example of a membrane device in the form of a power diode. For a 600 V power diode, the doping concentration of the n drift region 20 is in the range $3 \times 10^{15}$ to $10^{16}/cm^3$ with a length of 30 to 50 μm. The thickness of the drift layer 20 may be between 0.2 μm to 20 μm. The doping of the drift region 20 need not be constant and can vary from the source end to the drain end. For example, at the source end the doping may be $8 \times 10^{15}/cm^3$ while increasing linearly to $3 \times 10^{16}/cm^3$ at the drain end. For simplicity, only one cell of the diode is shown. FIG. 26*b* shows schematically an SOI version of the power diode shown in FIG. 26*a* in which an insulating layer 50 is formed underneath the drift region 20 which facilitates a more even distribution of the potential lines within the drift region 20 and therefore increases the breakdown ability of the diode. In addition, the insulating layer 50 acts as a very good etch stop and hence it makes formation of the membrane 16 easier. To help remove the heat while the power device is operational, a highly thermally conductive but electrically insulating layer 45 (not shown) may again be placed onto the back of the membrane 16 of the devices shown in FIGS. 26a and 26b. This layer 45 may be formed by sputtering or other ways of deposition as one of the last processing steps in the fabrication of the power integrated circuit as described above.

Figure 27A:
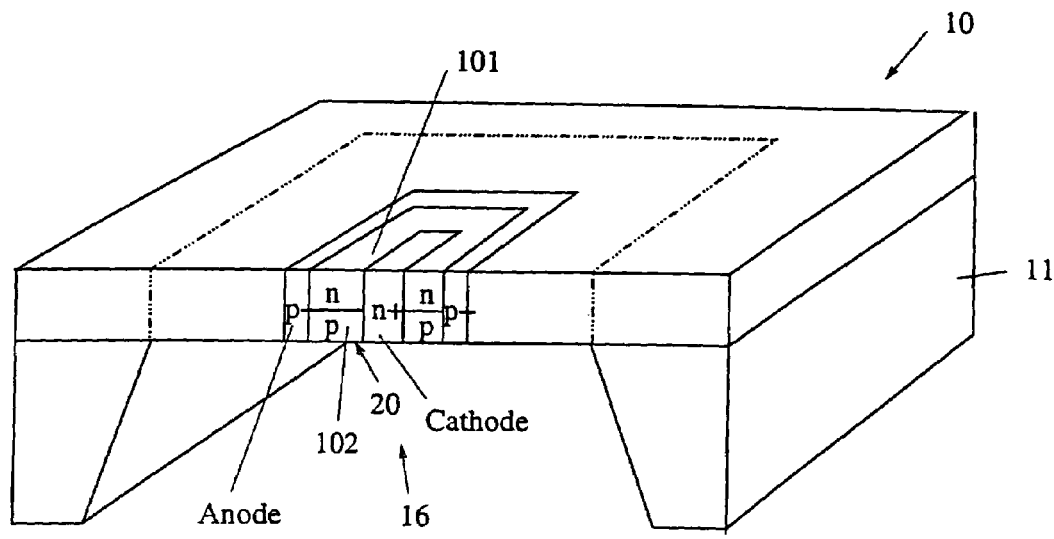
Figure 27B:
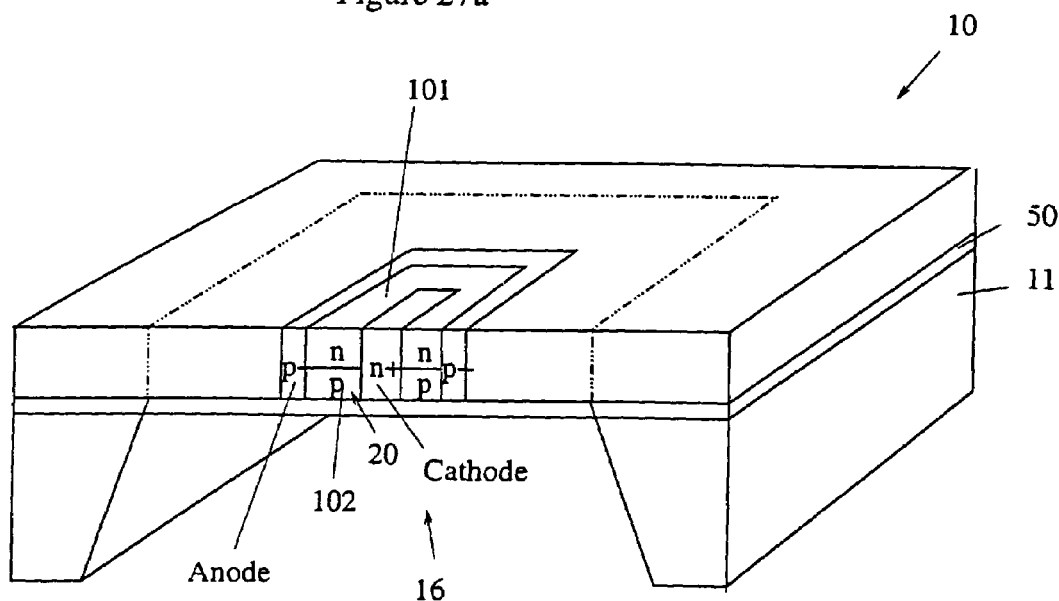

FIG. 27a shows schematically an example of a membrane power diode which comprises a drift region 20 formed by two layers 100,101 of different conductivity type n,p arranged vertically one on top of the other. These layers 100,101 may be formed by epitaxial growth or preferably by implant of one layer 101 into the other 102. For a 600 V power diode, the doping concentration of the two semiconductor layers 101,102 forming the drift region 20 may be between $10^{16}$ and $5 \times 10^{16}/cm^3$ with a length of 30 to 40 µm. The thickness of the two semiconductor layers 101,102 is between 0.1 µm and 20 µm. If the top semiconductor layer 101 is formed by implant, then the doping concentration of the top layer 101 will be higher than that of the bottom semiconductor layer 102 and hence, in order to maintain spatial charge equilibrium while the drift region 20 is depleted, the thickness of the top layer 101 is preferably less than that of the bottom layer 102. FIG. 27b shows schematically an SOI version of the power diode shown in FIG. 27a, whereby an insulating layer 50 is formed underneath the drift region 101,102. An additional highly thermally conductive but electrically insulating layer 45 (not shown) may again be placed under the membrane to facilitate the removal of heat, as described previously.

Figure 28A:
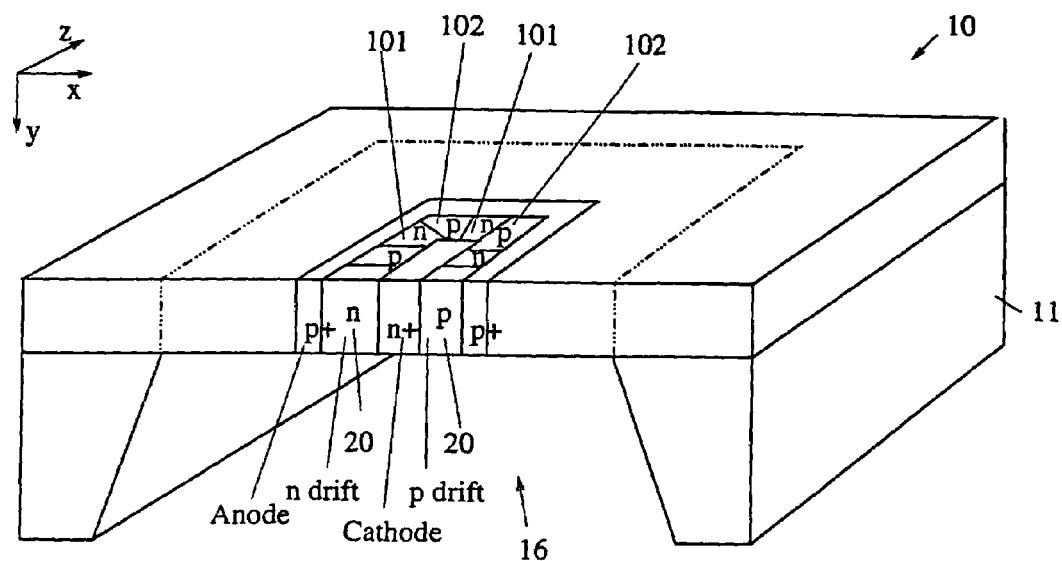
Figure 28B:
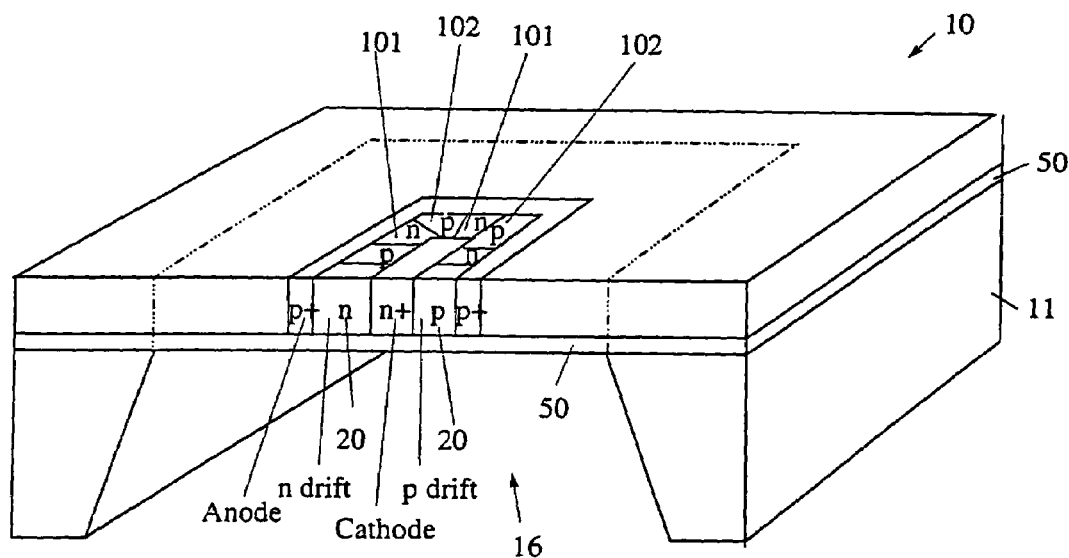

FIG. 28a shows schematically an example of a 3D membrane power diode. The drift region of the 3D power diode is comprised of several pairs of n,p regions 110,111 disposed in the x,z plane such that they form transverse junctions in the z direction. The widths of these n,p layers 110,111 may typically be between 0.2 µm and 5 µm, which represents a small fraction of their typical length. This ensures that the drift region 20 depletes faster in the z direction than in the x direction and therefore behaves similarly to an intrinsic layer in the voltage blocking mode. For a 600V device, the length of the drift regions 20 (in the x direction) may be approximately 30 µm. The doping of the n,p regions 110,111 may be between $10^{15}/cm^3$ and $6 \times 10^{16}/cm^3$. Preferably, the n,p regions 110,111 are formed by implanting one layer (e.g. an n layer) 110 into the other layer (e.g. a p layer) 14. Therefore, the doping concentration of the implanted layer 110 is higher than that of the background layer 111 and hence to maintain the charge equilibrium, the width of the implanted layer 110 is preferably smaller than that of the background layer 111. FIG. 28b shows schematically a SOI variant of the example of FIG. 28a. Again, in each case, an electrically insulating but thermally conductive layer 45 (not shown) may be deposited to extract heat.

Figure 29A:
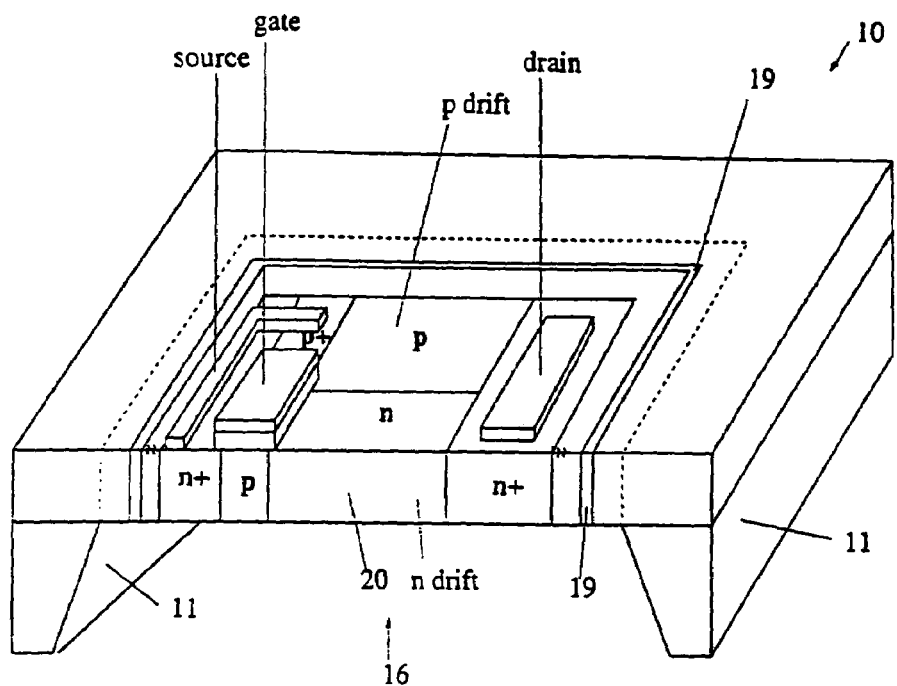
Figure 29B:
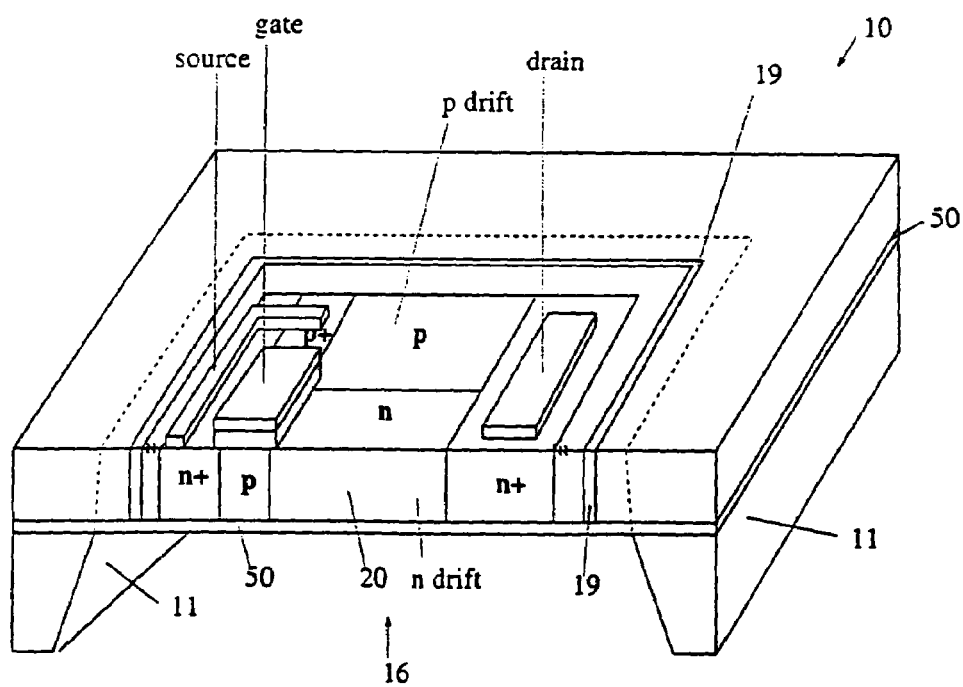

FIG. 29a shows schematically an example of a single gate membrane 3D LDMOSFET. The device employs the concept described above for the 3D membrane power diode to support a very high voltage between the source and drain terminals while in the voltage blocking mode, whereas in the conduction mode the device is similar to a conventional LDMOSFET and the device of FIG. 23a. FIG. 29b shows schematically a SOI variant of the example of FIG. 28a.

Again, in each case, an electrically insulating but thermally conductive layer 45 (not shown) may be deposited to extract heat.

Figure 30:
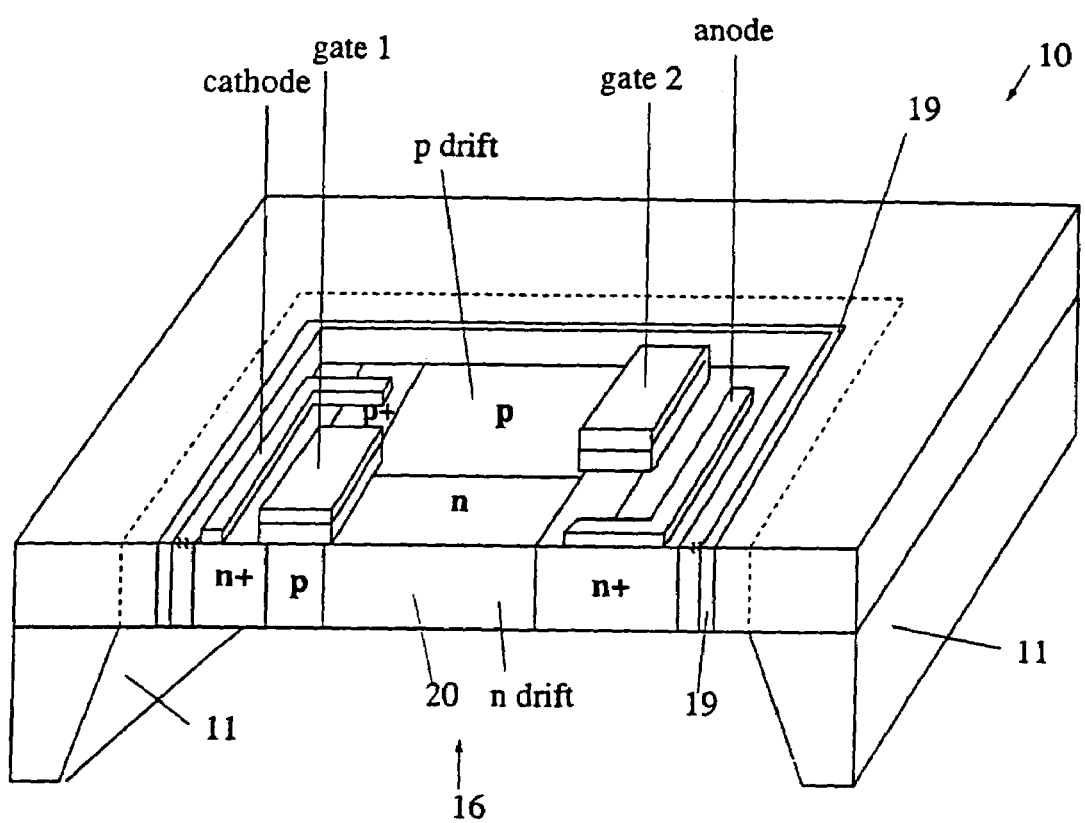

FIG. 30 shows schematically an example of a double gate membrane 3D LDMOSFET. The device again employs the concept described above for the 3D membrane power diode to support a very high voltage between the source and drain terminals. In the conduction mode, the device is controlled via both the n-channel and p-channel gates such that unipolar parallel conduction through the n and p stripes can occur. Bipolar conduction can also take place by injection of electrons into the p drift layer and of holes into the n drift layer.

Figure 31:
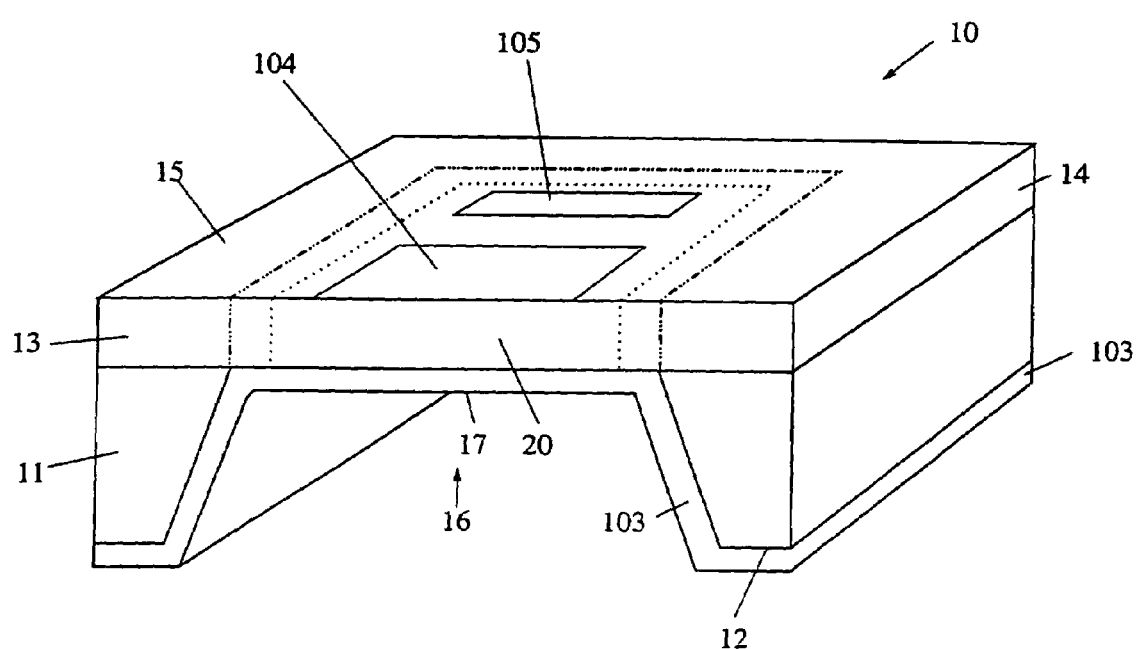

Referring now to FIG. 31, another example of a membrane power semiconductor device 10 according to the present invention has a semiconductor substrate 11 and a thin layer 13 which comprises at least one semiconductor layer 14 and has a top surface 15. The substrate 11 has a bottom surface 12 that forms the main bottom surface of the device. During manufacture, a portion of the substrate 11 below the thin layer 13 is removed up to the thin layer 13 to define a membrane 16 with a top surface 15 and a bottom surface 17. At least one main terminal layer 103 is attached to the bottom surface 17 and in contact with the semiconductor layer 14. In a preferred embodiment, said terminal layer 103 may be in the form of a metal layer deposited from the back side of the device 10 after the membrane 16 is formed by single side back-etching. The metal layer 103 may extend from the membrane bottom surface 17 to the main bottom surface 12 of the device 10 and is preferably in contact with an external heat sink. The device comprises at least one further main terminal 104 applied to the top surface 15, in contact with the semiconductor layer 14 and preferably within the membrane 16, such that in the on-state current conduction between the main top terminal 104 and the main bottom terminal 103 is substantially vertical and perpendicular to the top surface 15 and the membrane bottom surface 17. The device may have a control terminal 105 placed on the surface 15 to control the current between the main terminals 103,104. The power device 10 contains a drift layer 20 placed inside the first thin layer 13, within the semiconductor layer 14. At least a portion of the drift layer 20 is placed within the membrane 16.

The drift layer 20 supports the high voltages applied across the main terminals 103,104 whilst the power device 10 is off and blocks the voltage across the main terminals 103 and 104. During such operating mode, the drift layer 20 becomes partially or completely depleted of mobile carriers and the equipotential lines in a cross-section of the device 10 are parallel with the top surface 15 and the membrane bottom surface 17 and substantially uniformly distributed between the top end of the drift layer 20 and the bottom end of the drift layer 20.

The removal of the substrate 11 under part of the thin layer 13 results in a better trade-off between the on-state resistance and the breakdown performance. The uniform distribution of the potential lines inside the drift region in the membrane 16 results in ideal breakdown voltage for a given thickness of the drift region 20. Because the substrate 11 is removed under part of the thin layer 13, there is no substrate parasitic electrical and thermal resistance and isolation (not shown) from other devices and circuits present in the chip is easier to make. The terminal layer 103 is preferably highly thermally conductive to help dissipation of heat from the membrane region 11 to an external heat sink (not shown).

Figure 32:
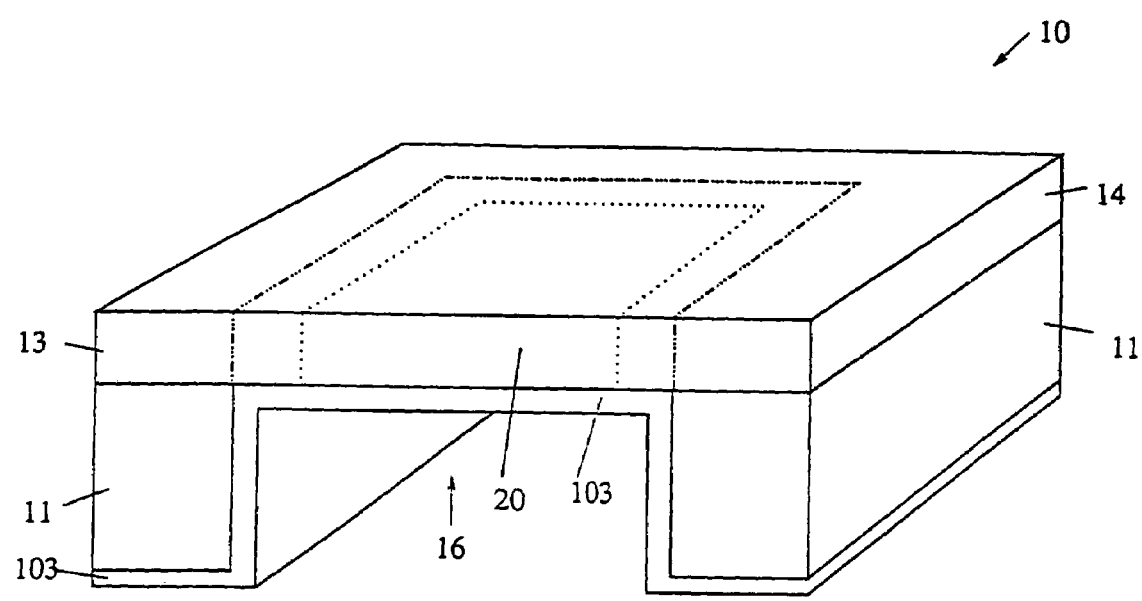

FIG. 32 shows schematically an example of a membrane power device 10 according to the present invention in which dry back-side etching is used to produce the membrane 16. The walls of the remaining portions of the substrate 11 are vertical as shown in FIG. 32. Following the membrane formation by dry etching, a terminal layer 103 is applied to the membrane bottom surface 17 to form one of the main terminals of the device 10. As previously explained the dry etch has the advantage that the volume occupied by the gap in the substrate 11 is no longer dependent on the thickness of the substrate 11 and therefore the area of the membrane 16 is easier to control.

Figure 33:
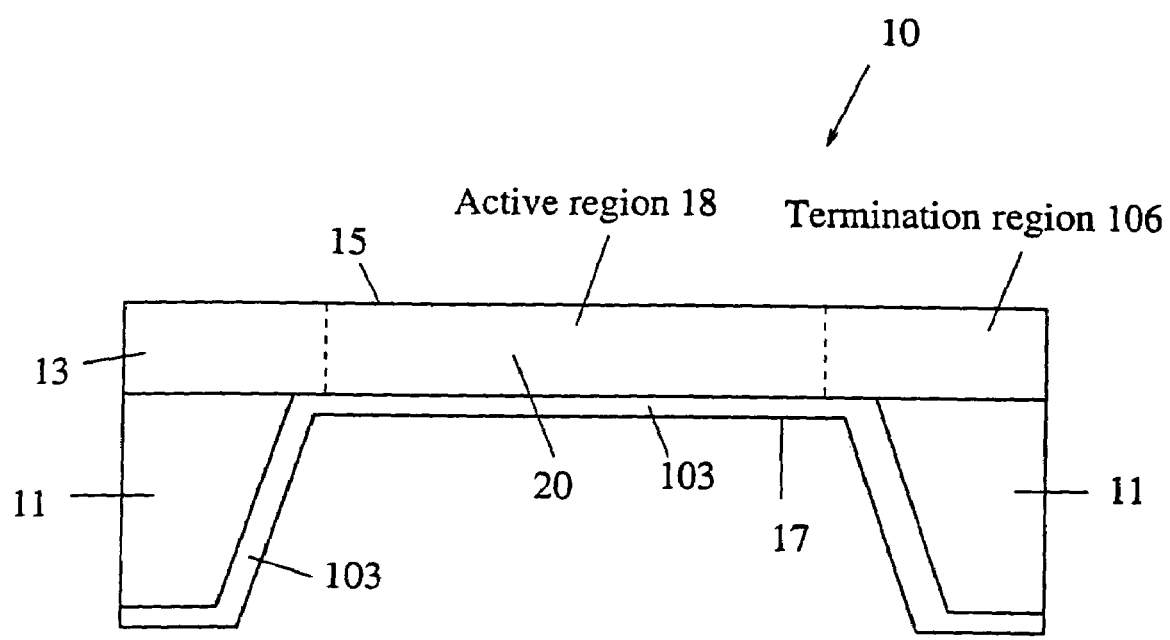

FIG. 33 shows a cross-section of the device 10 shown in FIG. 31. In this example, a termination region 106 of the device 10 is placed outside the membrane 16 whilst the active region 18 is placed within the membrane 16. The termination region 106 is used in power devices to suppress premature breakdown at the edge of the device 10 while the device blocks the voltage between the main terminals. The termination region 106 does not play an active role in the on-state and hence substantially no current conduction takes place in the termination region 106 during on-state operation. To minimise the on-state resistance and power losses, it is desirable that the drift layer 20 is as thin as possible. However, to support a higher breakdown at the device edge and thus force actual breakdown to occur in the active region, the termination region 106 is preferred to be thicker. For this reason, the active region 18 is placed inside the membrane 16 region whilst preferably the termination region 106 lies outside the membrane 16 on a thicker layer than the membrane 16. The termination 106 in this example benefits from having a substrate 11 underneath which facilitates the spreading of the depletion region in a wider volume while the device 10 blocks the high voltage across the main terminals. The termination region 106 and the substrate 11 may have a different doping than the drift layer 20 placed within the active region 18. In a preferred embodiment, the substrate 11 is more lowly doped than the drift region 20. The termination region 106 can be in the form of highly doped floating rings (known per se) encircling the active region 18 of the device 10 which help to spread the depletion region on a larger area at the surface, each pair of rings withstanding in the space between them a fraction of the total voltage, thereby reducing the risk of edge premature breakdown. This termination, known as floating ring termination, may comprise field plates and channel/depletion stoppers. Alternatively, the termination may be in the known form of junction termination extension (JTE) or field plate termination.

Figure 34:
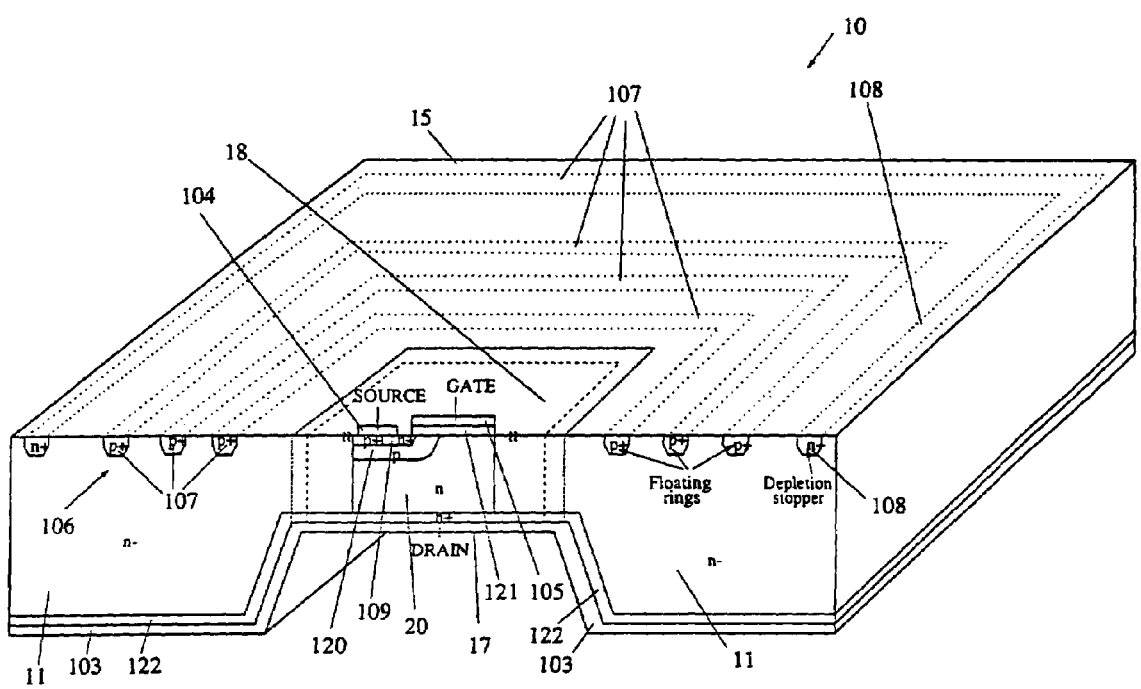

FIG. 34 shows in detail an example of a membrane vertical power MOSFET according to the present invention in which the active region 18 contains a drift region 20 of n conductivity type placed within the membrane 16 with a termination region 106 placed outside the membrane region 16. In this example, the termination region 106 is made of several concentric floating highly doped p-type rings 107 and a final highly doped n-type depletion stopper ring 108. The power MOSFET has highly doped n-type source 109 and drain 122 regions, an insulated gate formed by an insulating layer 121 and a polysilicon/metal layer 105 which acts as a control terminal. The source terminal 104 is placed on the top surface 15 and the drain terminal 103 is attached to the membrane bottom surface 17. The source terminal 104 contacts both the source region 109 and the p well 120. The drain terminal 103 contacts the highly doped n-type drain region 122. The operation of the MOSFET in the on-state relies on the formation of an inversion layer at the surface of the p well 120 when a gate voltage is applied to the control terminal 105. In this mode, electrons are transported from the source region 109 via the said inversion layer formed in the p well 120 through the drift region 20 to the drain region 122. To minimise the on-state resistance, it is preferred that the drift region 20 is thin and relatively more highly doped compared to the substrate 11. During the off-state, when a high voltage is applied across the main terminals 103,104, the drift region 20 is completely depleted of mobile carriers and supports the largest fraction of the voltage in the active area. The potential lines in the drift region 20 are parallel to the top surface 15 and the membrane bottom surface 17 and ideally uniformly distributed inside the drift layer 20. In the termination region 106, the depletion region has more room to spread inside the substrate 11, thereby avoiding crowding of potential lines and premature breakdown at the edge of the drift region. The substrate 11 may be more lowly doped than the surface of the termination region 106 and the drift region 20. It should be noted that there is substantially no on-state current conduction in the termination region 106 and therefore the thick and relatively lowly doped substrate 11 does not affect adversely the on-state resistance and does not add additional power losses as would have been otherwise expected if the substrate 11 had been present under the membrane 16. It will be understood that for simplicity, the internal structure of the MOSFET is only shown in two dimensions in FIG. 34.

Figure 35:
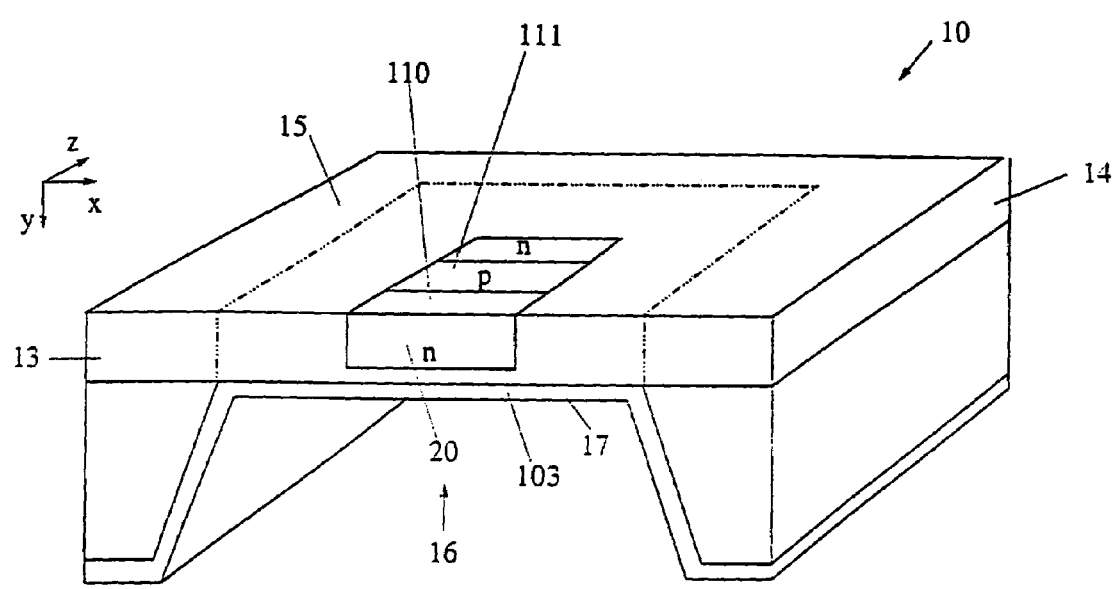

FIG. 35 shows a schematic perspective view of a 3D membrane power device 10 with a terminal 103 placed on the bottom 17 of the membrane 16. The drift region of the 3D membrane power device is comprised of several pairs of n, p regions 110,111 disposed in the x,z plane such that they form transverse junctions in the z direction. If the regions 110,111 are thinner in the z direction than in the y direction, the drift region 20 depletes faster in the z direction than in the y direction when a high voltage is applied across the main bottom terminal 103 and a top main terminal (not shown) placed on the top surface 15. This ensures higher breakdown ability and that the potential lines are parallel to the top surface 15 and the bottom surface 17 and substantially uniformly distributed across the drift region.

Figure 36A:
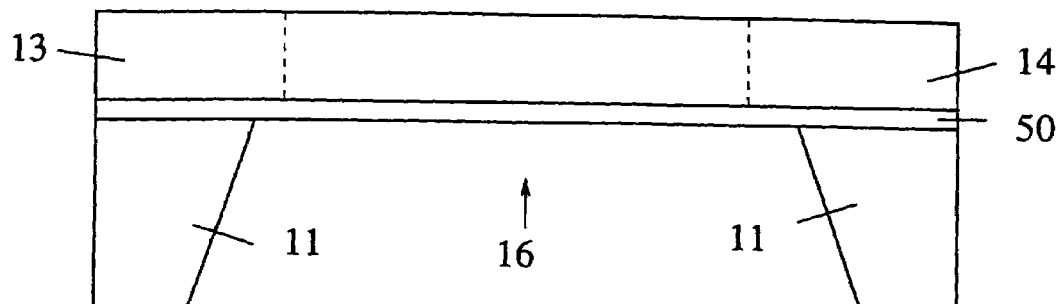
Figure 36B:
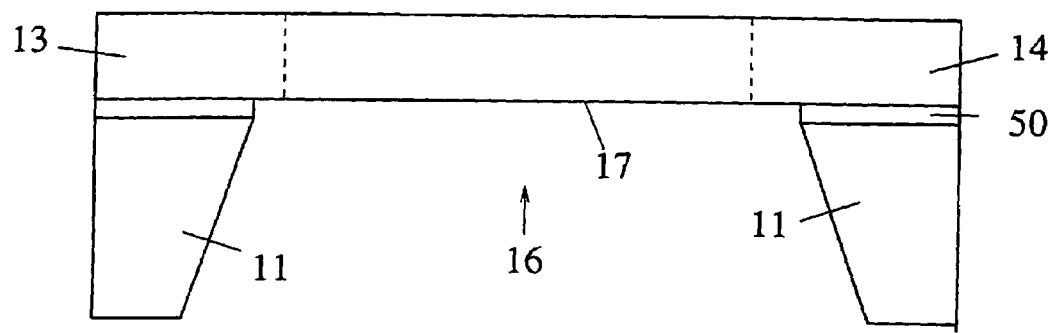
Figure 36C:
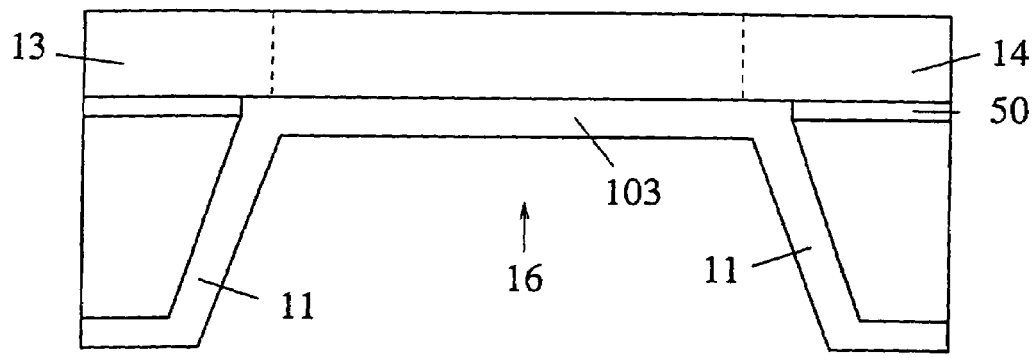

FIGS. 36a to 36c show schematically an example of a method of fabricating a device 10 according to the present invention. In this example, the thin layer 13 comprises a semiconductor layer 14 under which is provided a buried insulating oxide layer 50 under which is provided the substrate 11. As in the examples described above (for example with reference to FIG. 9), the semiconductor substrate 11 below the buried insulating layer 50 is partially removed by back-side etching with the buried insulating layer 50 acting as an etch-stop to form the membrane 16, as shown in FIG. 36a. In this example, as indicated in FIG. 36b, the portion of the buried insulating layer 50 below the membrane portion of the semiconductor layer 14 is also then removed so that the exposed bottom surface of the semiconductor layer 14 provides the bottom surface 17 of the membrane 16. This removal of the buried insulating layer 50 in the region of the membrane 16 allows a terminal layer 103 to be deposited on the back-side of the device. As shown, in this example, the bottom terminal layer 103 extends over the whole of the bottom surface 17 of the membrane 16 and down the inwardly facing sidewalls and under the bottom surfaces of the remaining leg portions of the substrate 11.

FIGS. 37 to 40 show schematically examples of a membrane power device 10 with a terminal attached to the membrane bottom surface in an integrated circuit containing low voltage/low power devices and circuits and other power devices.

Figure 37:
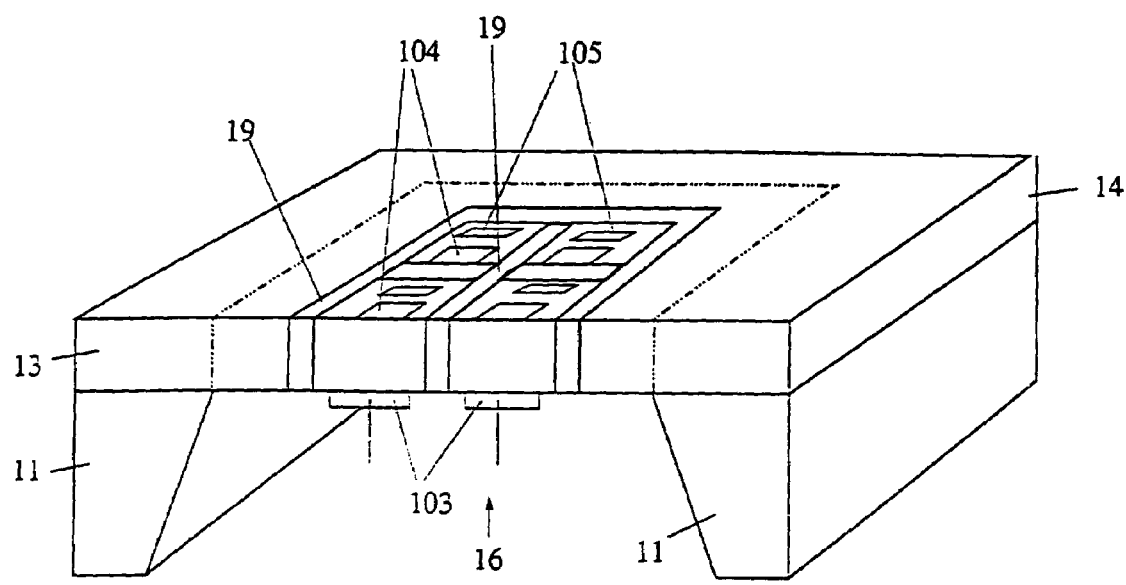

FIG. 37 shows for example four membrane power devices each featuring independent terminals with four main terminals 103 attached to the bottom of the membrane, and four main terminals 104 placed on the top of the membrane. Independent control terminals 105 can be used to control the operation of each individual power device. The power devices placed on the membrane 16 are isolated from each other through isolation layers 19 as described in previous examples.

Figure 38A:
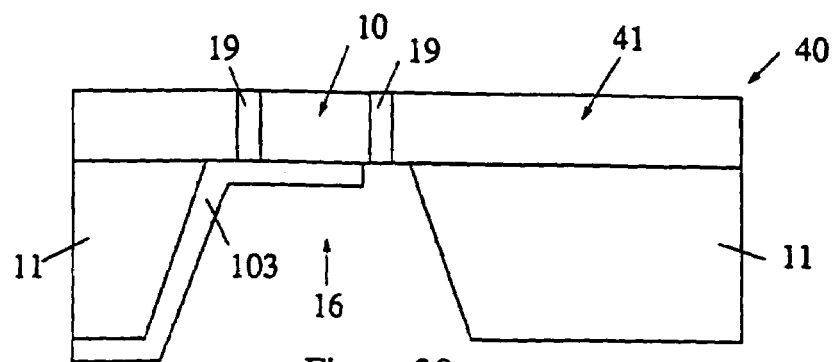
Figure 38B:
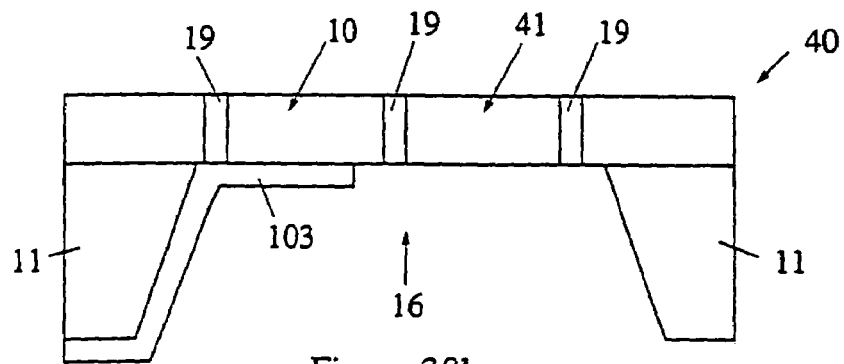
Figure 38C:
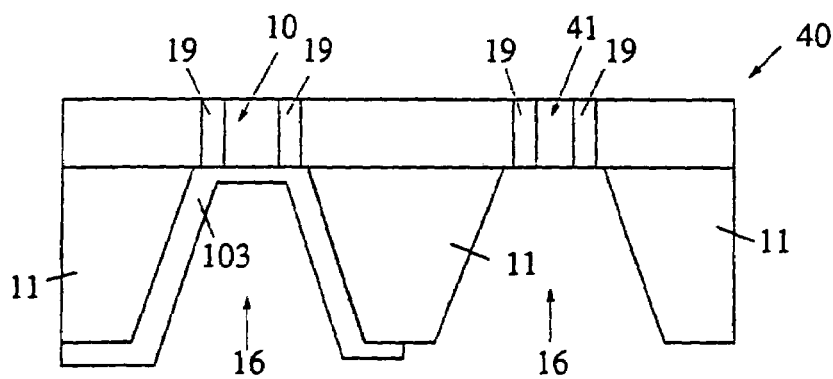
Figure 38D:
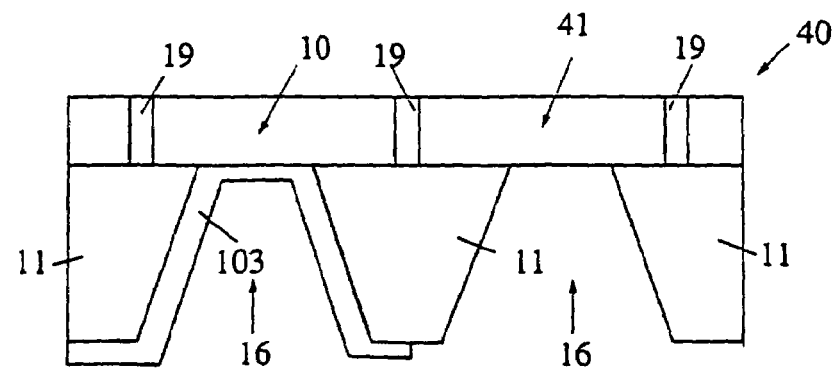
Figure 39A:
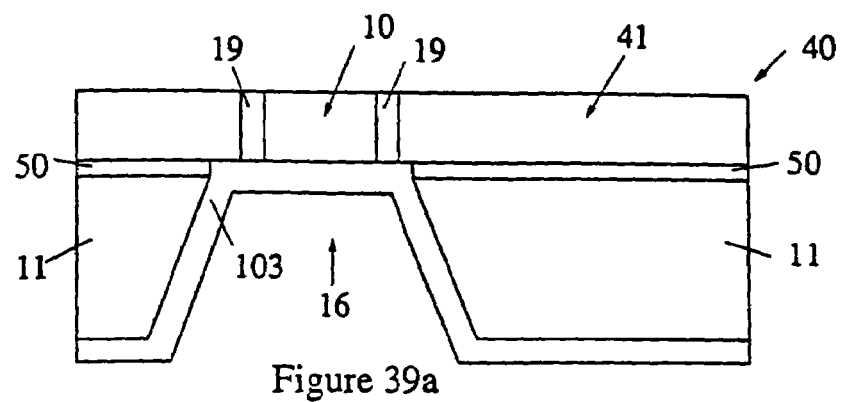
Figure 39B:
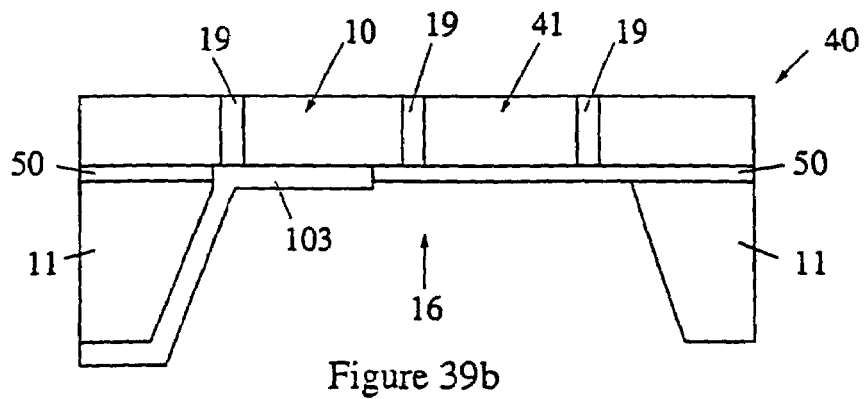
Figure 39C:
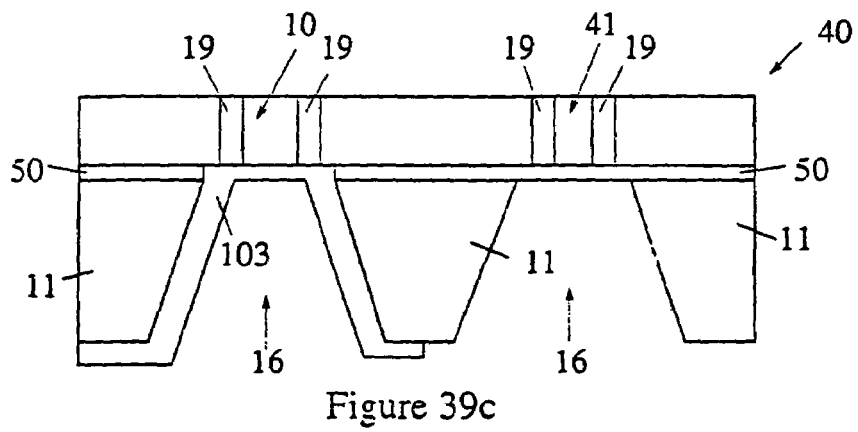
Figure 39D:
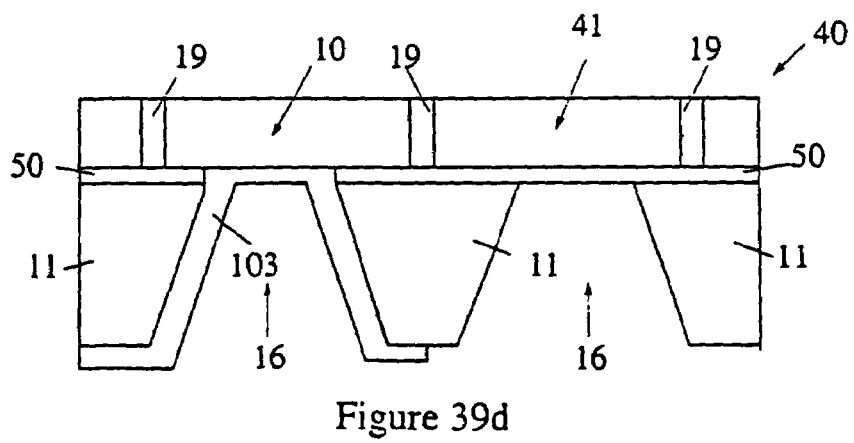

FIG. 38a shows a schematic cross-section of a power integrated circuit 40 which contains one membrane power device 10 with a main terminal 103 applied to the bottom surface and low power CMOS and bipolar devices 41 placed outside the membrane 16. Alternatively, the CMOS and bipolar devices 41 can also be placed within the membrane 16 as shown in FIG. 38b or on a separate membrane 16 formed over the same original substrate 11 as shown in FIG. 38c. Preferably the bottom terminal 103 does not extend under the low power devices and circuits. The example of FIG. 38d differs from that of FIG. 38c in that the isolation layers 19 are placed outside the membranes 16.

The structures shown schematically in FIGS. 39a to 39d are SOI corespondents to those shown in FIGS. 38a to 38d. In these examples, the insulating layer 50 is used as an etch stop to form the membrane 16. The insulating layer 50 also helps to isolate individual devices placed within the thin layer 13 from the substrate 11.

Figure 40A:
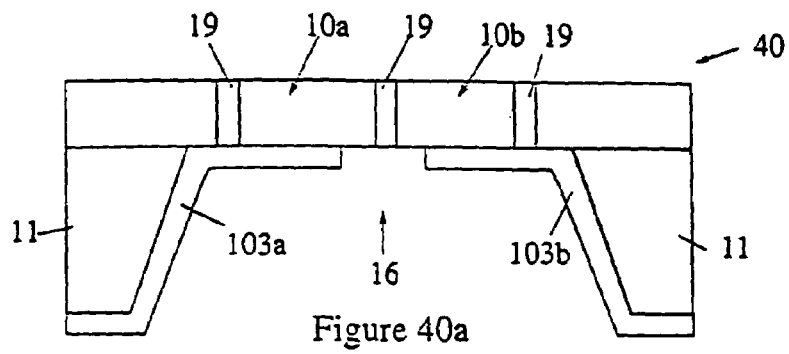
Figure 40B:
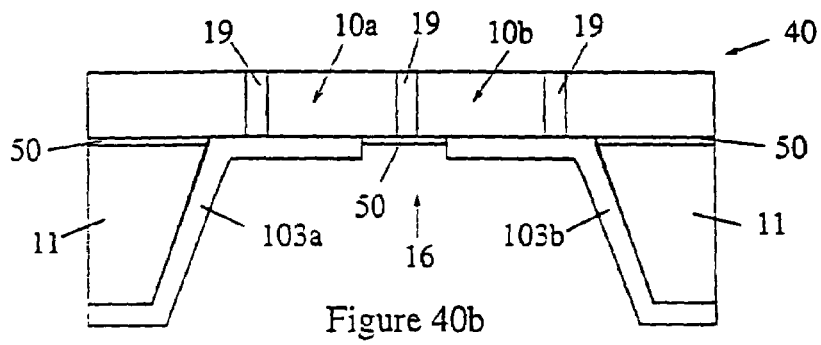
Figure 40C:
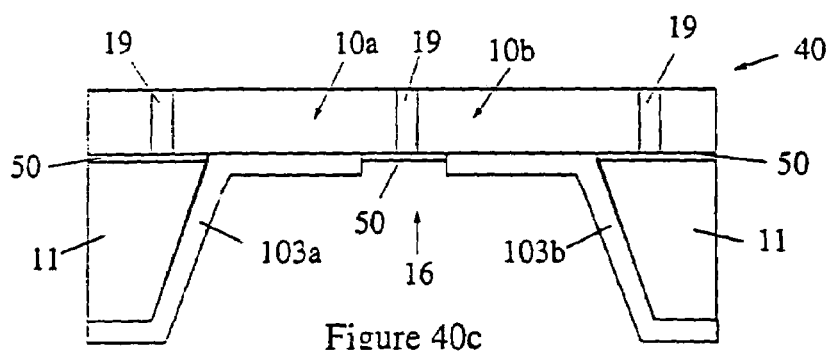
Figure 40D:
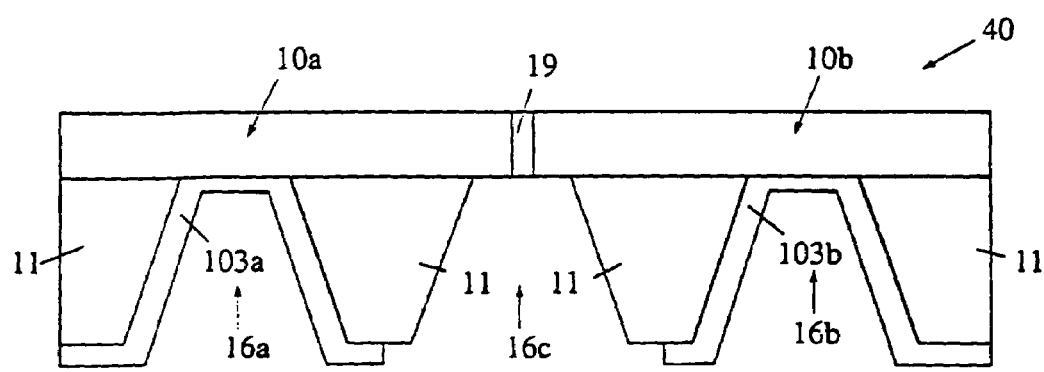

FIGS. 40a to 40d show schematically possible ways to integrate more than one membrane power device with independent main bottom terminals 103 in the same power integrated circuit 40. In the example of FIG. 40a, two power devices 10a and 10b each having a respective bottom main terminal 103a,103b are integrated on the same membrane 16. In the example of FIG. 40b, an insulating layer 50 is used to form the membrane 16 and help isolation of individual devices within the power integrated circuit 40. The example of FIG. 40c differs from that of FIG. 40b in that the outer isolation layers 19 are placed outside the membrane 16. The inner isolation layer 19 in the example of FIG. 40c which separates the first power device 10a from the second power device 10b remains within the membrane 16 as also shown in the example of FIG. 40b. In the example of FIG. 40d, the membrane power devices 10a,10b having independent bottom terminals 103a,103b respectively are placed on different membranes 16a,16b respectively formed above the same original substrate 11. To isolate the membrane power devices from each other, a further membrane 16c which may contain one isolation layer 19 is formed above the original substrate 11 and placed between the adjacent membrane power devices 10a,10b.

Figure 41A:
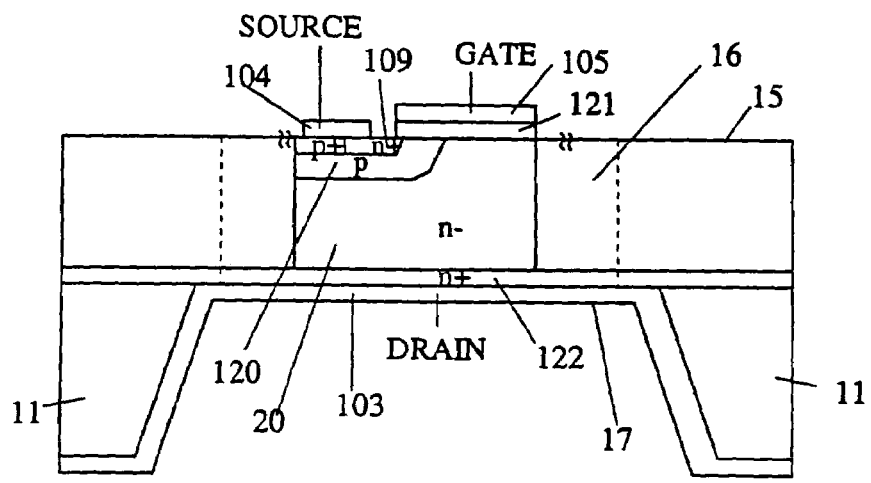
Figure 41B:
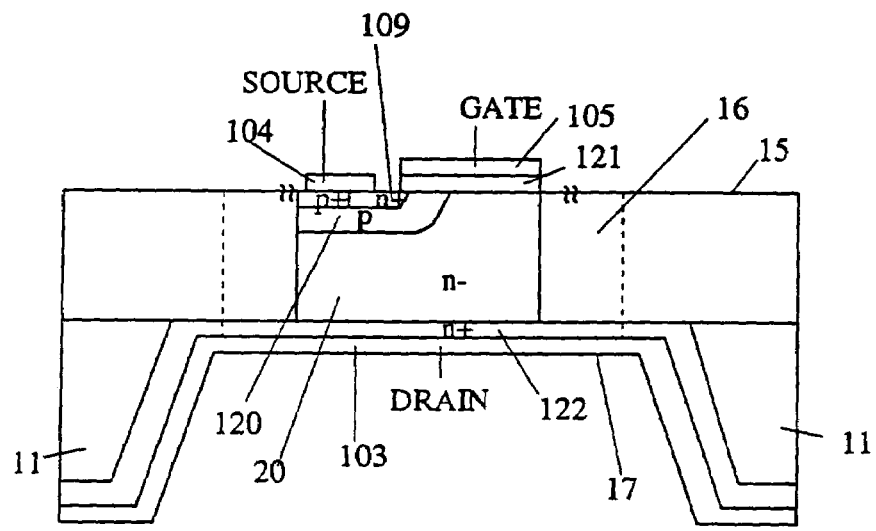
Figure 41C:
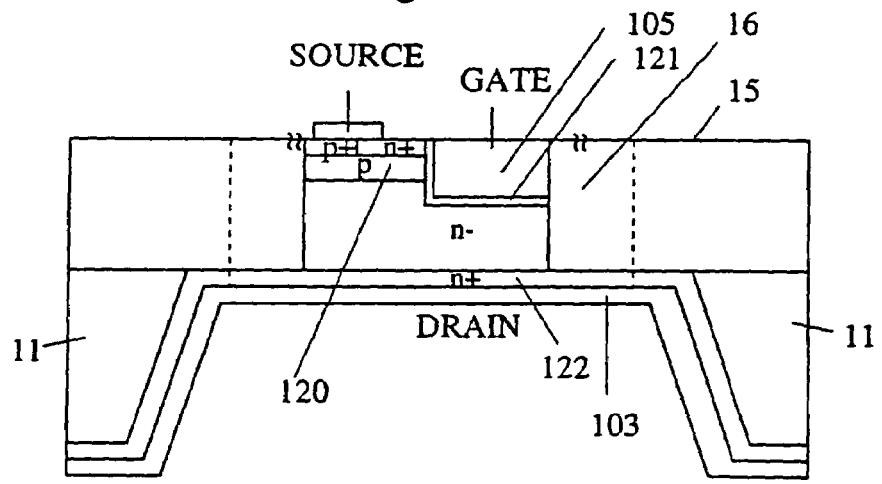

FIGS. 41a to 41c show in more detail examples of a membrane vertical power MOSFET. FIG. 41a shows a membrane vertical power MOSFET according to an embodiment of the present invention using the known DMOS technology. The power MOSFET has highly doped n-type source 109 and drain 122 regions, an insulated gate formed by an insulating layer 121 and a polysilicon/metal layer 105 which acts as a control terminal. The source terminal 104 is placed on the top surface 15 and the drain terminal 103 is attached to the membrane bottom surface 17. The source terminal 104 contacts both the source region 109 and the p well 120. The drain terminal 103 contacts the highly doped n-type drain region 122. The operation of the MOSFET in the on-state relies on the formation of an inversion layer at the surface of the p well 120 when a gate voltage is applied on the control terminal 105. In this mode, electrons are transported from the source region 109 via the said inversion layer formed in the p well 120 through the drift region 20 to the drain region 122. During the off-state, when a high voltage is applied across the main terminals 103,104, the drift region 20 is completely depleted of mobile carriers and supports the largest fraction of the voltage in the active area. The potential lines in the drift region 20 are parallel to the top surface 16 and the membrane bottom surface 17 and ideally uniformly distributed inside the drift layer 20. The highly doped n-type drain layer 122 may be a buried layer formed prior to the back-side etch which defines the membrane 16. In this way, the n-type layer 122 may be used as an indirect means to stop the back-etch using a known electrochemical technique. To facilitate the electrochemical etch, the substrate 11 may be of p-type doping to form a junction with the said n-type layer 122.

The example of FIG. 41b differs from the example of FIG. 41a in that the highly doped n-type drain layer 122 is formed by masked or blanket back-side deposition after the membrane 16 is formed. The drain terminal 103 is applied to the membrane bottom surface 17 after the membrane 16 is formed and the n-type drain layer 122 is introduced in the membrane 16 from the back-side of the device.

FIG. 41c shows an example of a membrane vertical power MOSFET according to an embodiment of the present invention using trench technology. The structure in FIG. 41c differs from that shown in FIG. 41b in the way the insulated gate is formed at the top of the structure. In the structure of FIG. 41c, the inversion layer in the 120 is formed vertically, substantially perpendicular to the top surface 15. This structure has the advantage of enhanced channel density and higher packing density.

Figure 42A:
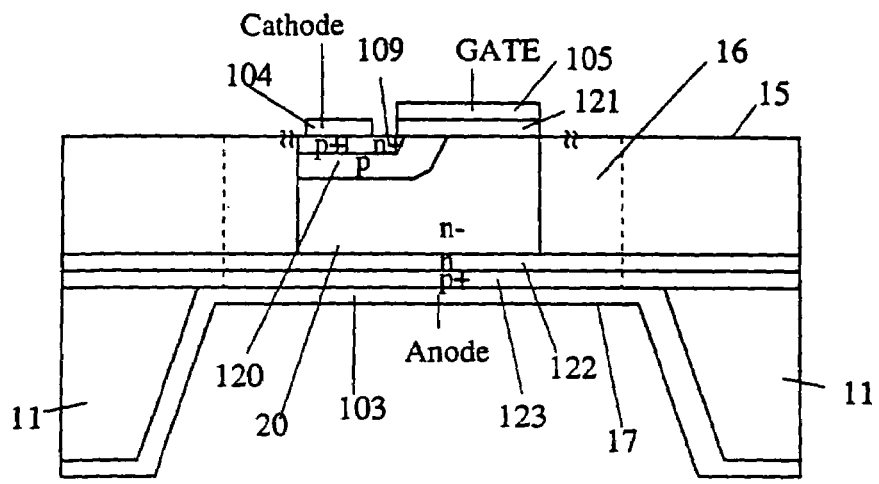
Figure 42B:
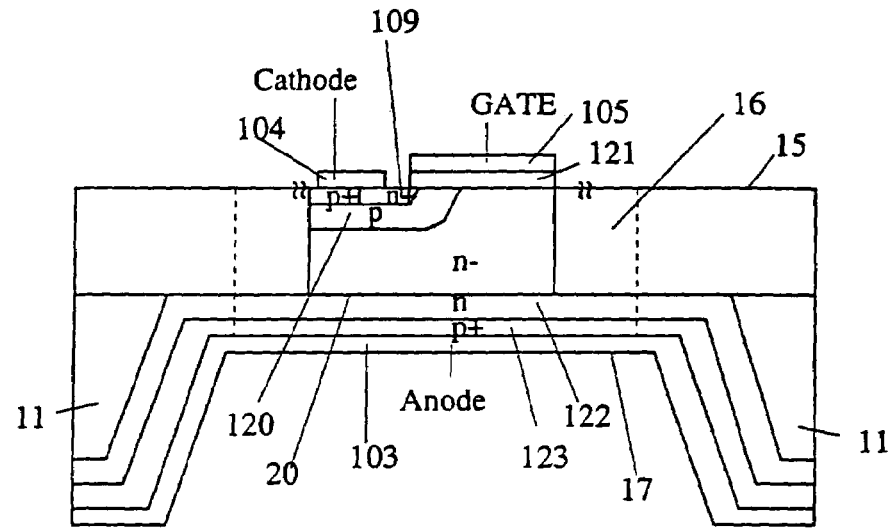
Figure 42C:
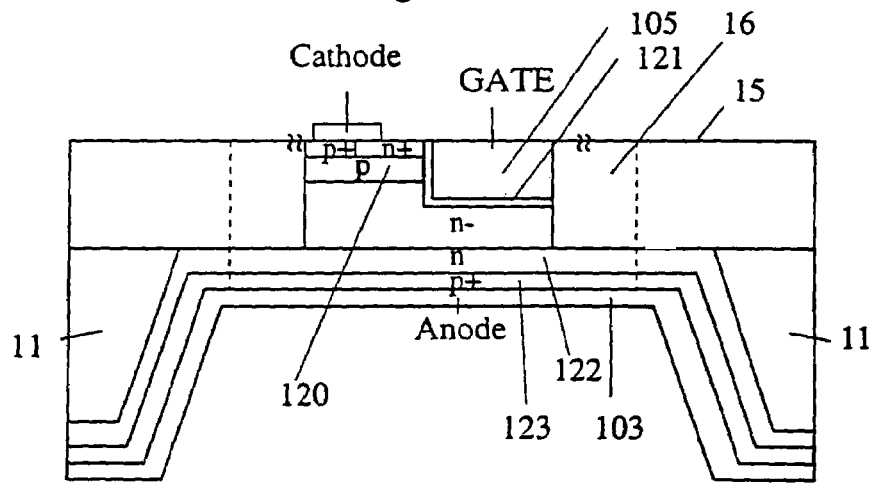

FIGS. 42a to 42c show in detail examples of vertical Insulated Gate Bipolar Transistors (IGBT) membrane power devices in which bipolar conduction within the drift region 20 suspended on the membrane 16 is employed and which generally correspond to the membrane vertical power MOSFETs shown in FIGS. 41a to 41c. The main difference in the IGBTs is the use of a highly doped p-type hole injector anode layer 123 in contact with the anode terminal 103. Bipolar conduction of the current is substantially perpendicular to the top surface 15 and is characterised by conductivity modulation in the drift layer 20 to reduce the on-state voltage drop across the drift layer 20. The n-type buffer layer 122 and the p-type anode layer 123 may be formed prior to the formation of the membrane 16 as shown in FIG. 42a or after the formation of the membrane 16 as shown in FIG. 42b. FIG. 42c shows a trench variant of the membrane IGBT shown in FIG. 42b. In FIG. 42a, the anode layer 123 may be used directly or indirectly as an etch-stop to form the membrane 16.

Figure 43A:
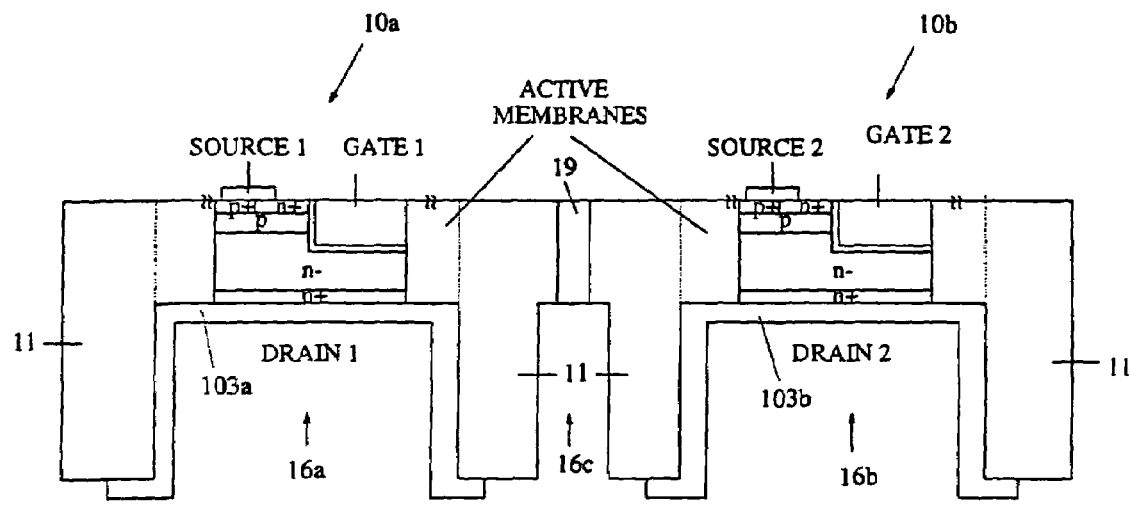
Figure 43B:
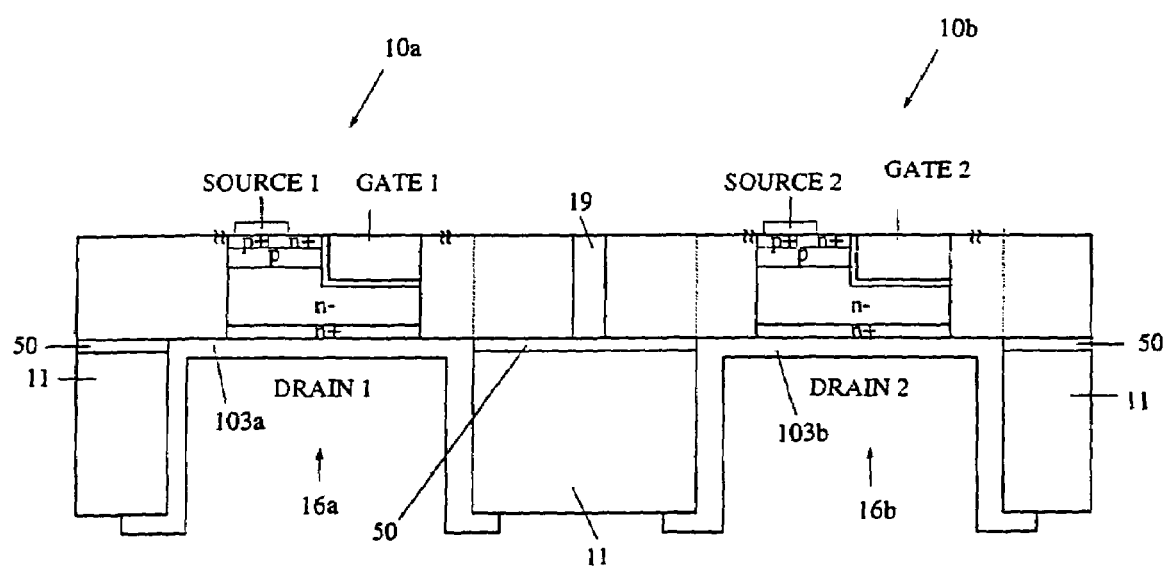

FIGS. 43a and b show examples of a power integrated circuit containing two vertical power MOSFETs 10a,10b using trench technology and suspended on separate membranes 16a,16b. In the example of FIG. 43a, the devices 10a,10b feature independent terminals and are isolated from each other through the use of a third membrane 16c and an isolation layer 19. The three membranes 16a,16b,16c are formed in the same step and in this example by use of a back-side dry etch which results in vertical walls for the remaining leg portions of the substrate 11 which, as previously described, are advantageous for obtaining a better control of the membrane area and integrating a large number of devices within the same chip. The example of FIG. 43b is a SOI variant of the example of FIG. 43a. The isolation layer 19 in this case is placed outside the membranes 16a and 16b and together with the buried dielectric layer 50 ensures an effective isolation of the two power devices 10a,10b from each other. The examples in FIGS. 43a and 43b show two membrane power MOSFETs integrated in the same chip, but any other membrane power devices can be used in a similar way and isolated from each other as shown in this figure.

Although the above examples refer primarily to silicon, the power membrane devices of the present invention can be built on other semiconductors, such as for example silicon carbide (SiC), diamond, GaAs, GaN or other III-V materials.

The drift region as part of the first thin layer 13 can be made of wide band gap materials, such as diamond, GaAs, GaN and SiC or can be made of heterojunctions such as GaN and AlGaN combinations or other suitable materials.

The insulating layer 50 is described primarily with reference to silicon dioxide but other insulating or semi-insulating materials, such as diamond, nitride or combinations of nitride and oxide, can be used.

The heat sink layer 45 can be made of diamond, aluminium nitride, boron nitride or other materials with good electrically insulating properties and high thermal conductivity.

Some examples of the thickness of the membrane 16 have already been given above. Generally, in a lateral device, the membrane 16 may have a thickness in the range 0.1 µm to 10 µm or 20 µm or so. Generally, in a vertical device, the membrane 16 may have a thickness in the range 6 µm or 10 µm to 60 µm or 100 µm or 180 µm or so.

Embodiments of the present invention have been described with particular reference to the examples illustrated. However, it will be appreciated that variations and modifications may be made to the examples described within the scope of the present invention.

The invention claimed is:

1. A method of forming a MOS-controllable power semiconductor device for use in an integrated circuit, the device having an active region that includes a drift region, the method comprising:

forming, in a layer provided on a semiconductor substrate, a power semiconductor device having an active region that includes a drift region;

removing at least a portion of the semiconductor substrate below at least a portion of the drift region such that said at least a portion of the drift region is provided in a membrane defined by that portion of the layer below which the semiconductor substrate has been removed, the membrane having opposed top and bottom surfaces, the bottom surface of the membrane not having a semiconductor substrate positioned adjacent thereto; and, connecting at least one electrical terminal directly or indirectly to the top surface of the membrane and at least one other electrical terminal directly or indirectly to the bottom surface of the membrane to allow a voltage to be applied vertically across the drift region.

2. A method according to claim 1, wherein said at least a portion of the semiconductor substrate is removed by wet etching.

3. A method according to claim 2, wherein said at least a portion of the semiconductor substrate is removed using a buried insulating layer as an etch stop.

4. A method according to claim 1, wherein said at least a portion of the semiconductor substrate is removed by dry etching.

5. A method according to claim 4, wherein said at least a portion of the semiconductor substrate is removed using a buried insulating layer as an etch stop.

6. A method according to claim 1, wherein at least one semiconductor layer is introduced by implantation, diffusion or deposition from the back-side of the device following the formation of the membrane.

7. A method according to claim 1, wherein a bottom terminal layer is applied to the bottom of the membrane, said bottom terminal layer being in contact with at least one semiconductor layer within the membrane.

* * * * *